(12) United States Patent
Iwamoto et al.

(10) Patent No.: US 6,292,040 B1
(45) Date of Patent: Sep. 18, 2001

(54) INTERNAL CLOCK SIGNAL GENERATING CIRCUIT HAVING FUNCTION OF GENERATING INTERNAL CLOCK SIGNALS WHICH ARE MULTIPLICATION OF AN EXTERNAL CLOCK SIGNAL

(75) Inventors: Hisashi Iwamoto; Wataru Sakamoto; Naoya Watanabe, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/047,375

(22) Filed: Mar. 25, 1998

(30) Foreign Application Priority Data

Oct. 3, 1997 (JP) .................................................. 9-271612

(51) Int. Cl.[7] ...................................................... H03L 7/06
(52) U.S. Cl. ........................... 327/158; 327/149; 327/161; 331/DIG. 2; 375/376
(58) Field of Search ..................................... 327/113, 116, 327/119, 121, 122, 147, 149, 156, 158, 161, 162, 163, 393, 396, 401; 375/373–376; 331/11, 12, 17, 25, 40, DIG. 2, 14; 365/189.07, 233, 233.5

(56) References Cited

U.S. PATENT DOCUMENTS

| 4,805,021 | * | 2/1989 | Harlos et al. | 348/536 |
|---|---|---|---|---|
| 5,548,235 | | 8/1996 | Marbot | 327/158 |
| 5,687,202 | * | 11/1997 | Eithrheim | 327/156 |
| 5,717,353 | * | 2/1998 | Fujimoto | 327/276 |
| 5,774,023 | * | 6/1998 | Irwin | 327/105 |
| 5,875,219 | * | 2/1999 | Kim | 327/156 |
| 5,910,740 | * | 6/1999 | Underwood | 327/149 |

OTHER PUBLICATIONS

"A 256Mb SDRAM Using a Register–Controlled . . . ", A. Hatakeyama, et al., 1997 IEEE International Solid–State Circuits Conference, pp. 72–73.

* cited by examiner

*Primary Examiner*—Timothy P. Callahan
*Assistant Examiner*—Minh Nguyen
(74) *Attorney, Agent, or Firm*—McDermott, Will & Emery

(57) ABSTRACT

An internal clock signal generating circuit includes a selector, a delay line, a 2-frequency divider, a phase comparator and a shift register. The selector alternately selects an external clock signal and an internal clock signal output from the delay line and outputs the selected signal to the delay line. The delay line receiving the signal delays the external clock signal, and delays the internal clock signal output from itself. The 2-frequency divider divides frequency of the internal clock signal by 2. Phase comparator compares phases of the external clock signal and the output signal from the 2-frequency divider. Delay time of the delay line is adjusted by the phase comparator and the shift register so that the phase difference is made 0.

11 Claims, 24 Drawing Sheets

FIG.3A ZPOR
FIG.3B EXTCLK
FIG.3C INTCLK
FIG.3D DIN
FIG.3E A
FIG.3F B
FIG.3G C
FIG.3H D
t0  t1  t2 t3 t4

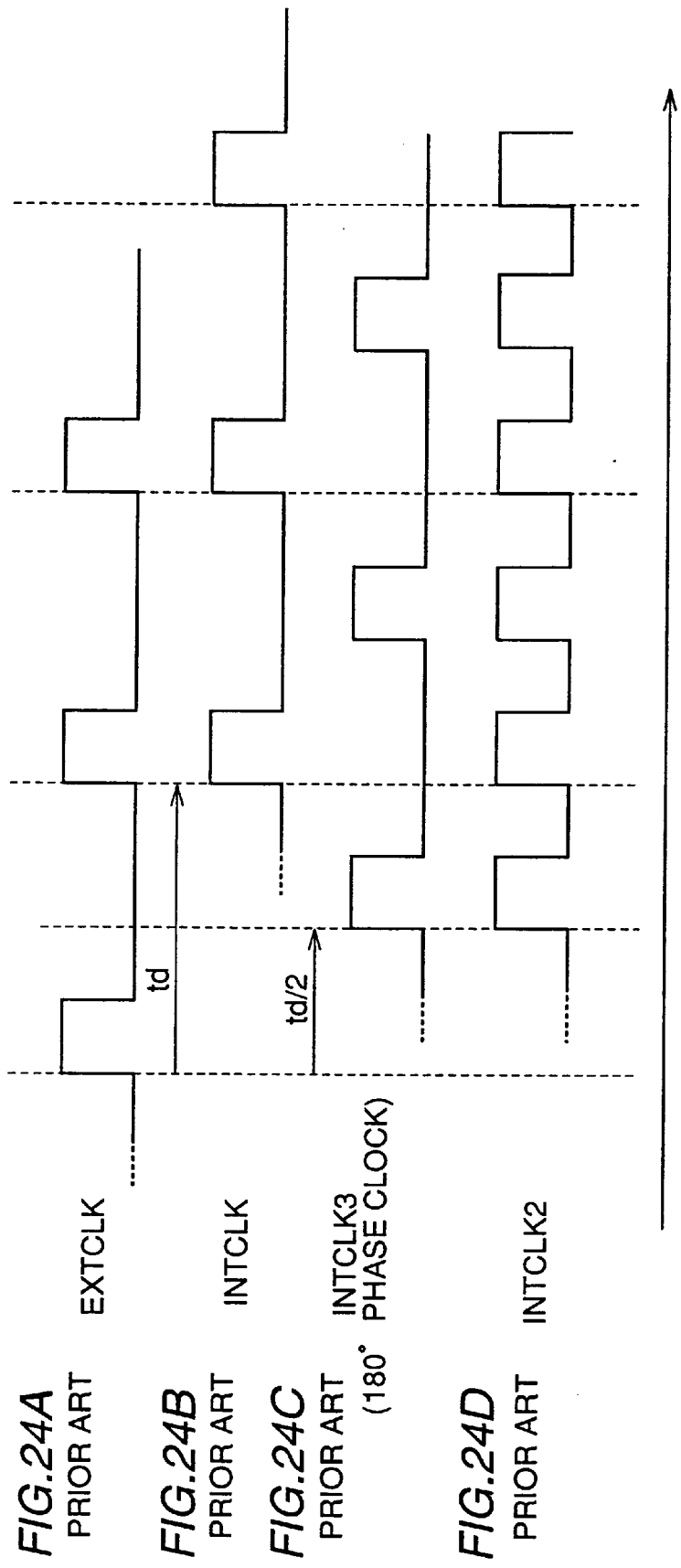

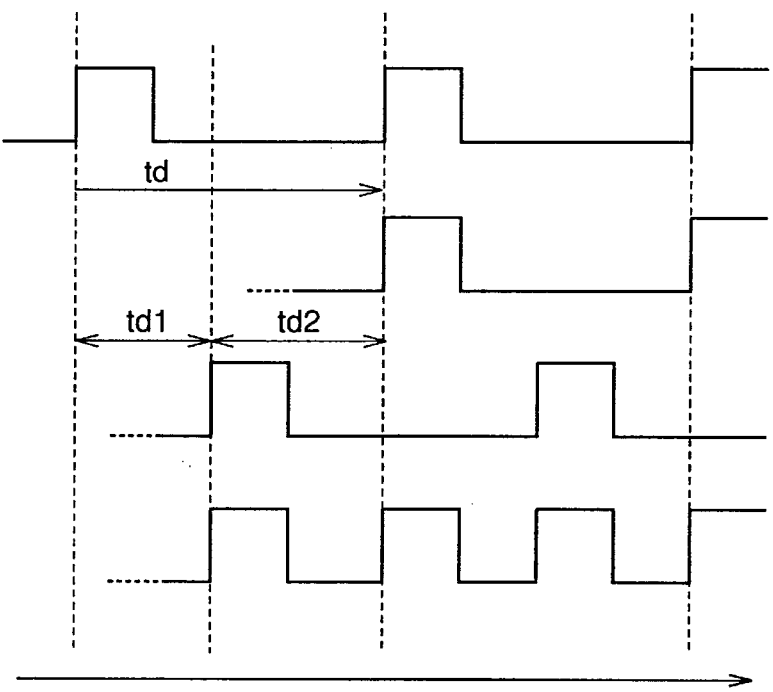
FIG.25A PRIOR ART EXTCLK
FIG.25B PRIOR ART INTCLK
FIG.25C PRIOR ART INTCLK3
FIG.25D PRIOR ART INTCLK2

INTERNAL CLOCK SIGNAL GENERATING CIRCUIT HAVING FUNCTION OF GENERATING INTERNAL CLOCK SIGNALS WHICH ARE MULTIPLICATION OF AN EXTERNAL CLOCK SIGNAL

BACKGROUND OF THE INVENTION

1. Field of the Invention

The present invention relates to an internal clock signal generating circuit. More specifically, the present invention relates to an internal clock signal generating circuit for generating, in synchronization with an externally applied clock signal, signals which are multiplication of the externally applied clock signal.

2. Description of the Background Art

As speed of operation of microprocessors has been ever increasing, increase in speed of internal clock signals for operating overall system including a semiconductor memory device has come to be a critical problem in view of the system performance. This is because the internal clock signal restricts operational frequency of the overall system in relation to the access time.

To meet the demand of higher internal clock signals, a delay lock loop (hereinafter referred to as DLL circuit) has been proposed as an internal clock signal generating circuit which receives an externally applied clock signal (external clock signal) and generates an internal clock signal which is in synchronization with the external clock signal.

In the following, a structure of the conventional DLL circuit will be described with reference to FIG. 17.

The conventional DLL circuit 900 shown in FIG. 17 includes a delay line 2, a shift register 4, a phase comparator 16 and a delay circuit 8. DLL circuit 900 is a digital type DLL circuit which suppresses power supply noise more effectively than an analog type DLL circuit.

Delay line 2 delays an input external clock signal EXT-CLK and outputs an internal clock signal INTCLK 1. Delay circuit 8 delays internal clock signal INTCLK 1 by td2 and outputs the resulting signal (clock signal INTCLK 2).

Phase comparator 16 compares phases of external clock signal EXTCLK and of clock signal INTCLK 2 output from delay circuit 8. As a result of phase comparison, phase comparator 16 outputs an UP signal or a DOWN signal. Shift register 4 receives at its input the UP signal or the DOWN signal output from phase comparator 16, and changes delay time of delay line 2.

Structure of delay line 2 and a relation with shift register 4 will be described with reference to FIG. 18.

Delay line 2 shown in FIG. 18 includes a plurality of delay units U0, U1, . . . , Un, elements D0, D1, . . . , Dn and a plurality of NMOS transistors N1.0, N1.1, . . . , N1.n. In the following, delay units U0, U1, . . . , Un will be generally referred to as delay unit U, and elements D0, D1, . . . , Dn as element D.

Each delay unit U includes inverter circuits 40 and 41. Elements D0, D1, . . . , Dn are connected to output nodes of corresponding delay units U0, U1, . . . , Un, respectively. NMOS transistors N1.0, N1.1, . . . , N1.n are connected between a signal line a10 and corresponding elements D, respectively.

Delay unit U0 receives a clock signal (in FIG. 18, IN). Over signal line a10, a signal (in FIG. 18, OUT) is output.

Shift register 4 includes a plurality of registers L0, L1, . . . , Ln. In the following, registers L0, L1, . . . , Ln will be generally referred to as register L.

Registers L0, L1, . . . , Ln are provided corresponding to NMOS transistors N1.0, N1.1, . . . , N1.n, respectively. NMOS transistors N1.0, N1.1, . . . , N1.n receive at respective gate electrodes, corresponding control signals d(0), d(1), . . . , d(n) from corresponding registers L.

Any one of the control signals d(0), d(1), . . . , d(n) output from shift register 4 is in an active state. In response to control signals d(0), d(1), . . . , d(n), the number of delay units U through which input signal IN is passed is determined.

The structure of shift register 4 will be described with reference to FIG. 19.

As shown in FIG. 19, shift register 4 includes a plurality of registers L0, L1, L3, . . . , and a logic gate 47.

Logic gate 47 receives at its input the DOWN signal and the UP signal output from phase comparator 16, and outputs a signal T0. Registers L (except L0) each include an NAND circuit 43, inverter circuits 44, 45 and 46, and NMOS transistors N2, N3 and N4.

A first input node of each NAND circuit 43 receives a reset signal ZRST. Each NMOS transistor N3 receives at its gate electrode the DOWN signal output from phase comparator 16. Each NMOS transistor N4 receives at its gate electrode the UP signal output from phase comparator 16. Each NMOS transistor N2 receives at its gate electrode the signal T0 output from logic gate 47.

Circuit structure of the register will be described, taking register L2 as a representative example. NAND circuit 43 has a second input node connected to a node O2 (connection node between register L2 and register L1 of the preceding stage).

Inverter circuit 44 is connected between a node O2 and an output node of NAND circuit 43. NMOS transistor N2 is connected between inverter circuit 45 and NAND circuit 43. Inverter circuit 46 is connected between an output node and an input node of inverter circuit 45.

NMOS transistor N3 is connected between a node O3 (connection node between register L2 and register L3 of the succeeding stage) and inverter circuit 45. NMOS transistor N4 is connected between inverter circuit 45 and a node O1 (connection node between registers L0 and L1).

In shift register L0, an output node of NAND circuit 43 is connected to a node O0. Inverter circuit 44 is connected between node O0 and the second input node of NAND circuit 43. NMOS transistor N2 is connected between inverter circuits 45 and 44. It does not include NMOS transistor N4 for receiving the UP signal.

Between a node O0 and a ground potential GND, an NMOS transistor N3 receiving the DOWN signal is arranged.

Control signals d(0), d(1), . . . are output from corresponding output nodes (input nodes of inverter circuit 46) of respective inverter circuits 45 of registers L.

In the following, output signals from NAND circuits 43 in respective registers L1, L2, . . . will be represented as s(1), s(2), . . . , and the output signal from inverter circuit 44 in register L0 will be represented as s(0).

The operation of shift register 4 will be described with reference to timing charts of FIGS. 20A to 20L.

Referring to FIGS. 20A to 20L, at time t0, reset signal ZRST is set to an L (low) level. Consequently, shift register 4 is set to an initial state. Signal d(0) is set to 1. A signal d(k) (where 1<k≦n) is set to 0.

Thereafter, reset signal ZRST is set to an H (high) level.

Thereafter, at time t1, when DOWN signal rises to the H level, a signal T0 falls to the L level.

In response to control signal d(m), a signal s(m+1) (where $1 \leq m \leq n-1$) makes a transition. More specifically, upon reception of control signal d(0), signal s(1) goes from 1 to 0, as shown in FIGS. 20F and 20G.

Thereafter, at time t2, when DOWN signal falls to the L level, signal T0 rises to the H level.

In response to signal s(m), control signal d(m) (where $0 \leq m \leq n$) changes. More specifically, in response to signal s(0), control signal d(0) changes from 1 to 0 as shown in FIGS. 20E and 20F.

In the similar manner thereafter, when DOWN signal rises to the H signal, signal s(m+1) changes in response to control signal d(m) (where $0 \leq m \leq n-1$) in synchronization with the rising edge of DOWN signal.

When DOWN signal falls to the L level, control signal d(i) changes in response to signal s(i) (where $0 \leq i \leq n$) in synchronization with the falling edge of DOWN signal.

More specifically, in synchronization with the rising edge of DOWN signal, state of the control signal is transferred in one direction (from d(m) to d(m+1)).

When UP signal rises to the H level, signal s(x−1) changes in response to control signal d(x) (where $1 \leq x \leq n$) in synchronization with the rising edge of UP signal.

When UP signal falls to the L level, control signal d(i) changes in response to signal s(i) (where $0 \leq i \leq n$) in synchronization with the falling edge of UP signal.

More specifically, state of the control signal is transferred in the other direction (from d(x) to d(x−1)) in synchronization with the rising edge of UP signal.

The operation of the conventional DLL circuit 900 will be briefly described with reference to timing charts of FIGS. 21A to 21C.

Delay time of delay line 2 is represented as td0. Delay time of delay circuit 8 is represented as td2.

Referring to FIGS. 21A to 21C, for a kth external clock signal, a kth internal clock signal INTCLK 1 is generated. For the kth internal clock signal INTCLK 1, a kth clock signal INTCLK 2 is generated.

More specifically, when a first external clock signal EXTCLK is input, a first internal clock signal INTCLK 1 is output after the lapse of td0. Further, a first clock signal INTCLK 2 is output after the lapse of td2.

When a second external clock signal EXTCLK is input, a second internal clock signal INTCLK 1 is output after the lapse of td0, and a second clock signal INTCLK 2 is output after the lapse of td2.

Here, phase comparator 16 detects phase difference between clock signal INTCLK 2 and external clock signal EXTCLK. As a result, delay time of delay line 2 is adjusted (delay time td1).

Interconnection for interface between semiconductor memory devices comes to be longer and the number of branches connecting buses has been increasing. Therefore, increase in operational frequency of the semiconductor memory device comes to be increasingly difficult.

In view of the foregoing, in order to improve system performance, a desired clock is internally generated to increase operational frequency.

A DLL circuit for generating multiplied clock signals will be described with reference to FIG. 22. DLL circuit 910 shown in FIG. 22 includes a delay line 22, a selector 17, a phase comparator 16 and an OR circuit 19.

Delay line 12 outputs internal clock signals INTCLK and INTCLK 3. When delay time for internal clock signal INTCLK is given as td, delay time for internal clock signal INTCLK 3 is td/2.

OR circuit 19 receives internal clock signals INTCLK and INTCLK 3, and outputs internal clock signal INTCLK 2.

Basic structure of delay line 12 and the relation with selector 17 will be described with reference to FIG. 23.

Selector 17 shown in FIG. 23 may have the same structure as shift register 4 described above. Selector 17 outputs control signals d(0), d(1), d(2), ..., d(n) in response to DOWN signal or UP signal output from phase comparator 16. Any of control signals d(0), d(1), d(2), ..., d(n) is in an active state. The active state moves in accordance with the DOWN signal or the UP signal.

Delay line 12 includes delay portions 14 and 15. Basic structure of delay portions 14 and 15 is the same as delay line 2 shown in FIG. 18.

Delay portion 14 receives an external input signal (in FIG. 23, DIN), and outputs internal clock signal INTCLK 3 through signal line a10.

Delay portion 15 has its input node connected to signal line a10 of delay portion 14. In delay portion 15, internal clock signal INTCLK is output from a signal line a11.

More specifically, in DLL circuit 910, the delay line is divided into two (delay portions 14, 15), and positions where signals are taken out are made the same in delay portions 14 and 15, whereby signals having phases shifted by 180° from each other are generated.

The operation of the conventional DLL circuit 910 will be described with reference to the timing charts of FIGS. 24A to 24D.

In the figures, external clock signal EXTCLK and internal clock signal INTCLK are shown in phase with each other.

Referring to FIGS. 24A to 24D, when external clock signal EXTCLK is input, after a period td/2, internal clock signal INTCLK 3 is generated. After a period td, internal clock signal INTCLK is generated.

As a result, by obtaining sum of internal clock signals INTCLK 3 and INTCLK through OR circuit 19, an internal clock signal (INTCLK 2) multiplied by 2 is obtained.

U.S. Pat. No. 5,548,235 entitled "Phase-Locked Loop and Resulting Frequency Multiplier" discloses a circuit for generating clock signals multiplied by two by dividing a delay line.

However, when internal clock signals multiplied by two are generated by dividing a delay line, accuracy in multiplication may possibly be degraded, since signals are passed through different delay lines.

An example in which delay accuracy in delay portions 14 and 15 involved with delay line 12 differ from each other because of process variation or the like in conventional DLL circuit 910 shown in FIG. 23 will be briefly described with reference to the timing charts of FIGS. 25A to 25D.

In this case, as shown in FIGS. 25A to 25D, internal clock signal INTCLK is generated delayed by td from external clock signal EXTCLK. Meanwhile, internal clock signal INTCLK 3 is generated delayed by td1 from external clock signal EXTCLK. However, because of different delay accuracy, relation between the time periods would be td1≠td/2. As a result, desired clock signals multiplied by two cannot be obtained.

SUMMARY OF THE INVENTION

Therefore, an object of the present invention is to provide an internal clock signal generating circuit capable of generating multiplied signals with high accuracy.

The internal clock signal generating circuit in accordance with the present invention is for generating an internal clock signal which is synchronized in phase with an external clock signal, the circuit including a delay line for delaying an input signal and outputting an internal clock signal, a selecting circuit for selectively outputting to the delay line an internal clock signal output from the delay line or the external clock signal, a first frequency dividing circuit for dividing the internal clock signal, and a delay control circuit detecting phase difference between the external clock signal and the signal output from the first frequency dividing circuit, for controlling delay time in the delay line based on the result of detection.

Therefore, an advantage of the present invention is that the internal clock signal which is synchronized in phase with the external clock signal is subjected to frequency division and fed back to the delay line of the same state, so that internal clock signals which are multiplication of the external clock signal can be generated.

According to another aspect of the present invention, the internal clock signal generating circuit includes a first clock signal generating circuit for generating, based on an external clock signal, a first internal clock signal which is synchronized in phase with the external clock signal, and a second internal clock signal generating circuit for generating, based on the first internal clock signal output from the first clock signal generating circuit, a second internal clock signal which is synchronized in phase with the first internal clock signal. The first clock signal generating circuit includes a first delay line for delaying an input signal and outputting the first internal clock signal, a selecting circuit for selectively outputting to the first delay line one of the internal clock signal output from the first delay line and the external clock signal, a frequency dividing circuit for dividing frequency of the first internal clock signal, and a first delay control circuit detecting phase difference between the external clock signal and a signal output from the frequency dividing circuit for controlling delay time over the first delay line based on the result of detection. The second clock signal generating circuit includes a second delay line for delaying the first internal clock signal and outputting the second internal clock signal, and a second delay control circuit detecting phase difference between the second internal clock signal output from the second delay line and the first internal clock, for controlling delay time over the second delay line based on the result of detection.

Therefore, an additional advantage of the present invention is that signals which are multiplication of the external clock signal can be generated and that phase of the generated multiplied signals can be shifted, as the clock generating circuit capable of generating the internal clock signals which are multiplication of the external clock signal is provided in the preceding stage and the clock generating circuit different from that of the preceding stage is further provided.

According to a still further aspect of the present invention, the clock generating circuit includes a first clock signal generating circuit for generating, based on an external clock signal, a first internal clock signal which is synchronized in phase with the external clock signal, and a second clock signal generating circuit for generating, based on the first internal clock signal output from the first clock signal generating circuit, a second internal clock signal which is synchronized in phase with the external clock signal. The first clock signal generating circuit includes a first delay line for delaying an input signal and outputting the first internal clock signal, a selecting circuit for selectively outputting to the first delay line one of the first internal clock signal output from the first delay line and the external clock signal, a first frequency dividing circuit for dividing frequency of the first internal clock signal, and a first control circuit detecting phase difference between the signal output from the first frequency dividing circuit and the external clock signal, for controlling delay time over the first delay line based on the result of detection. The second clock signal generating circuit includes a second delay line delaying the first internal clock signal to output the second internal clock signal, a second frequency dividing circuit for dividing frequency of the second internal clock signal, and a second delay control circuit detecting phase difference between the signal output from the second frequency dividing circuit and the external clock signal, for controlling delay time over the second delay line based on the result of detection.

Therefore, a further advantage of the present invention is that influence of jitter generated in the circuit can be suppressed and therefore highly precise internal clock signals can be generated, as the clock generating circuit capable of generating internal clock signals which are multiplication of the external clock signal by feeding back and inputting to the delay line of the same state the internal clock signal which is synchronized in phase with the external clock signal is provided in the preceding stage and a clock signal for phase comparison using the external clock signal as a reference is provided in the succeeding stage, different from the preceding stage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3H are timing charts showing the operation of selector 20 in accordance with the first embodiment of the present invention.

FIGS. 24A to 24D are timing charts showing the operation of the conventional DLL circuit 910.

FIGS. 25A to 25D are timing charts showing the problem of DLL circuit 910 shown in FIG. 23.

DESCRIPTION OF THE PREFERRED EMBODIMENTS

First Embodiment

A DLL circuit in accordance with the first embodiment will be described in the following.

The DLL circuit in accordance with the first embodiment of the present invention is capable of generating highly accurate multiplied signals of which phase is synchronized with an external clock signal, and further capable of generating clock signals with the duty ratio of 50%.

The structure of the DLL circuit in accordance with the first embodiment of the present invention will be described with reference to a schematic block diagram of FIG. 1.

Figure 17:
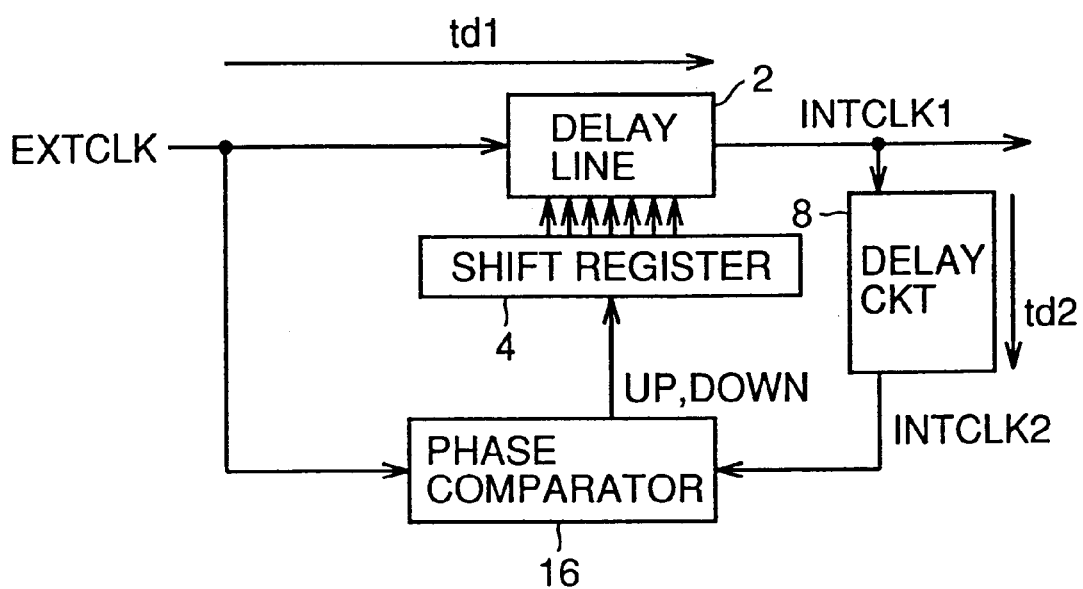
FIG. 17 is a schematic block diagram showing a basic structure of a conventional DLL circuit 900.
Figure 18:
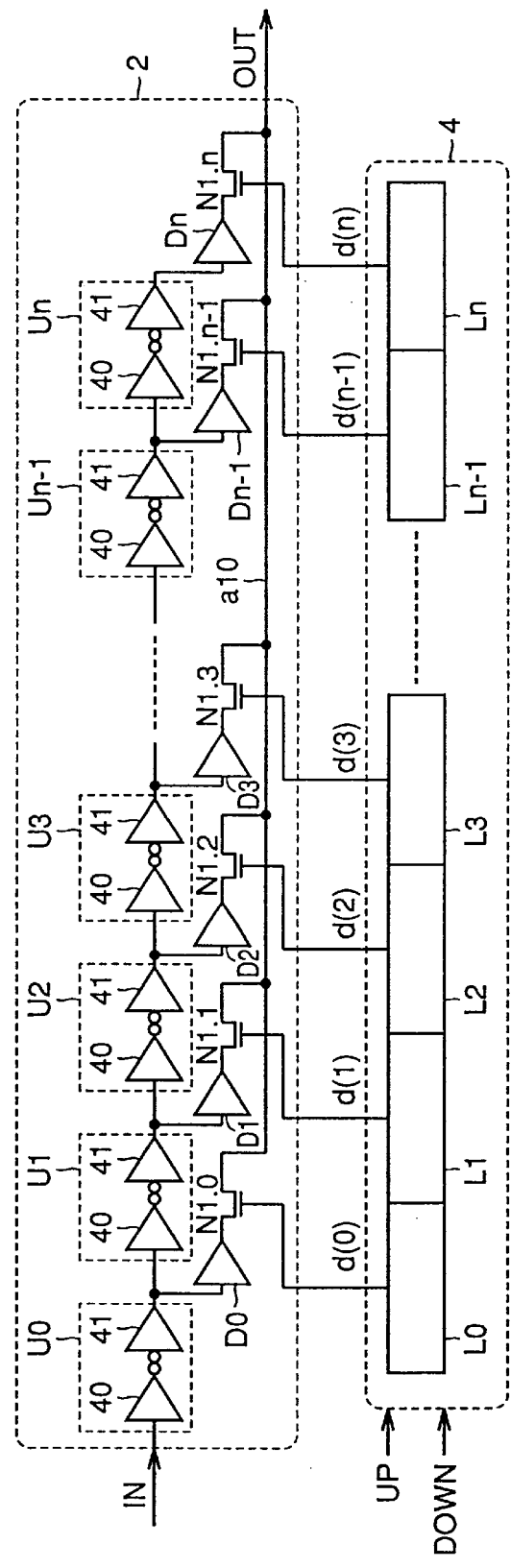
FIG. 18 is a schematic diagram showing a basic structure of delay line 2.
Figure 19:
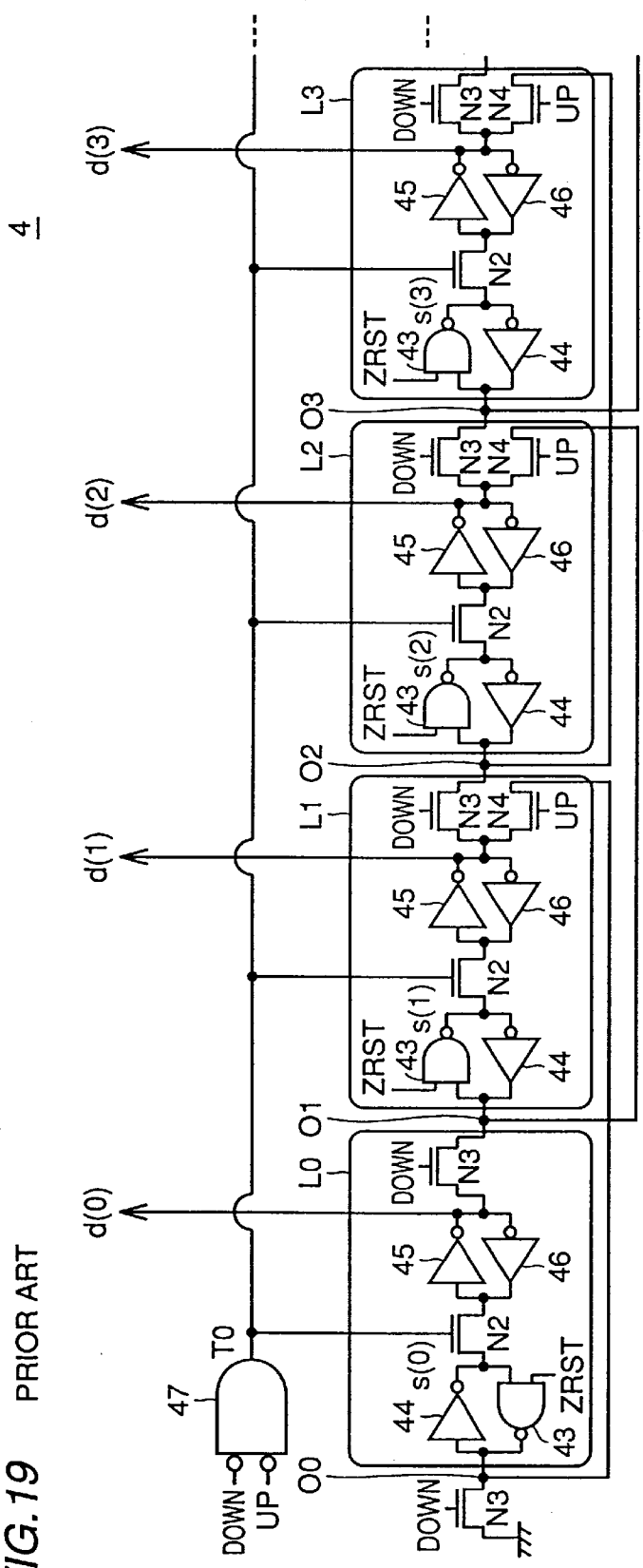
FIG. 19 is a schematic diagram showing a basic structure of shift register 4.
Figure 20:
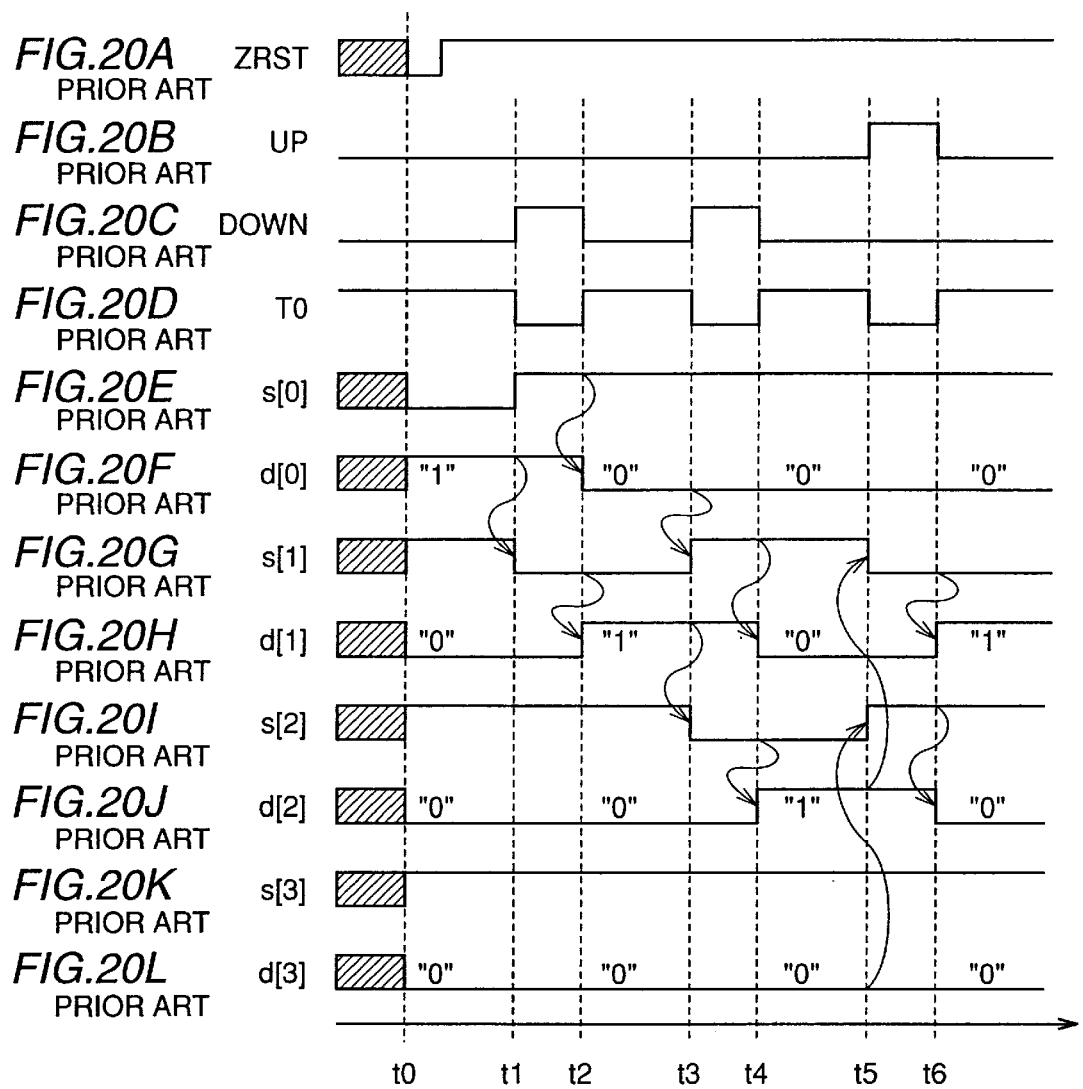
FIGS. 20A to 20L are timing charts showing the operation of shift register 4.
Figure 21:
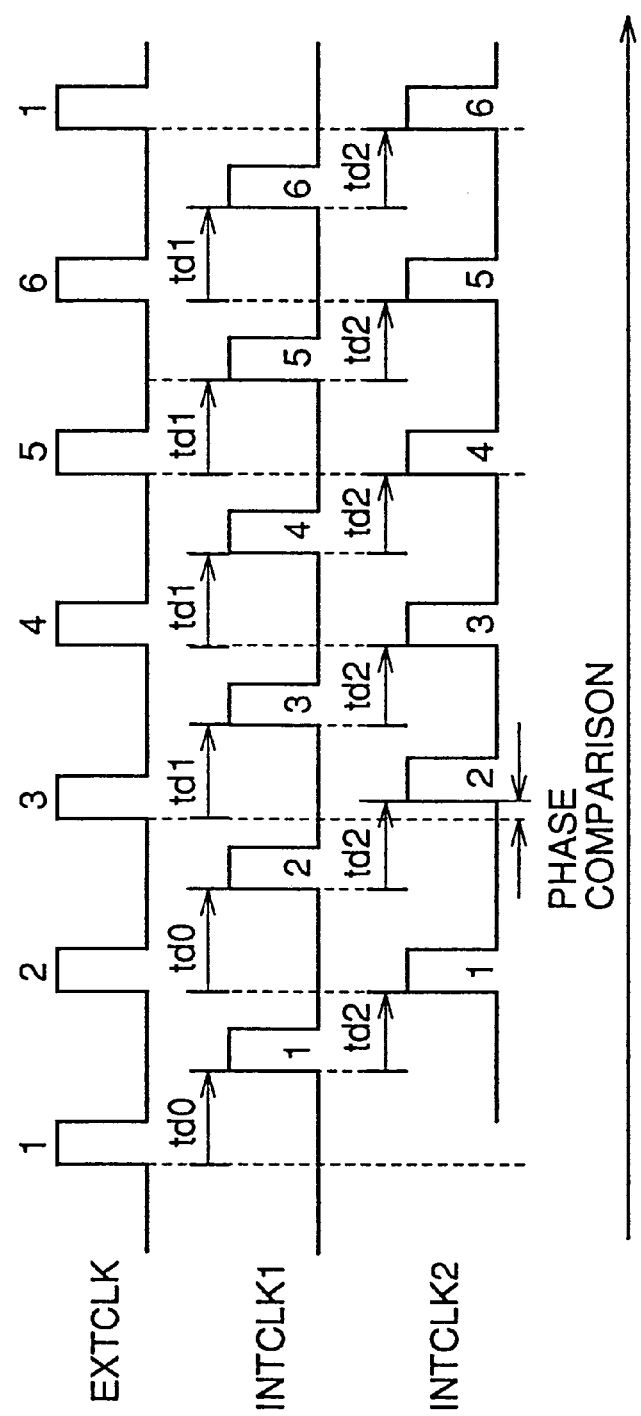
FIGS. 21A to 21C are timing charts showing the operation of conventional DLL circuit 900.
Figure 22:
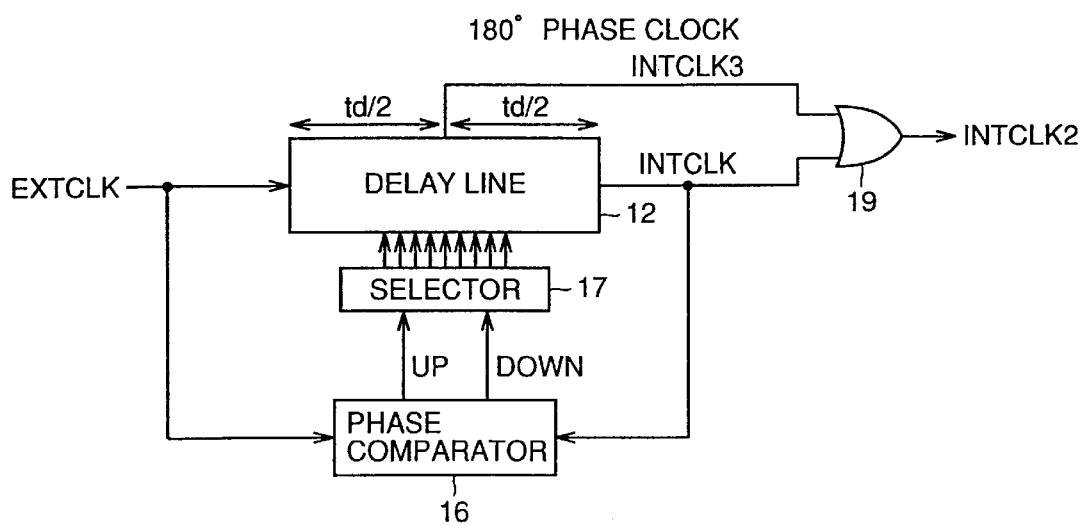
FIG. 22 is a block diagram showing a basic structure of a DLL circuit 910 for generating multiplied clock signals.
Figure 23:
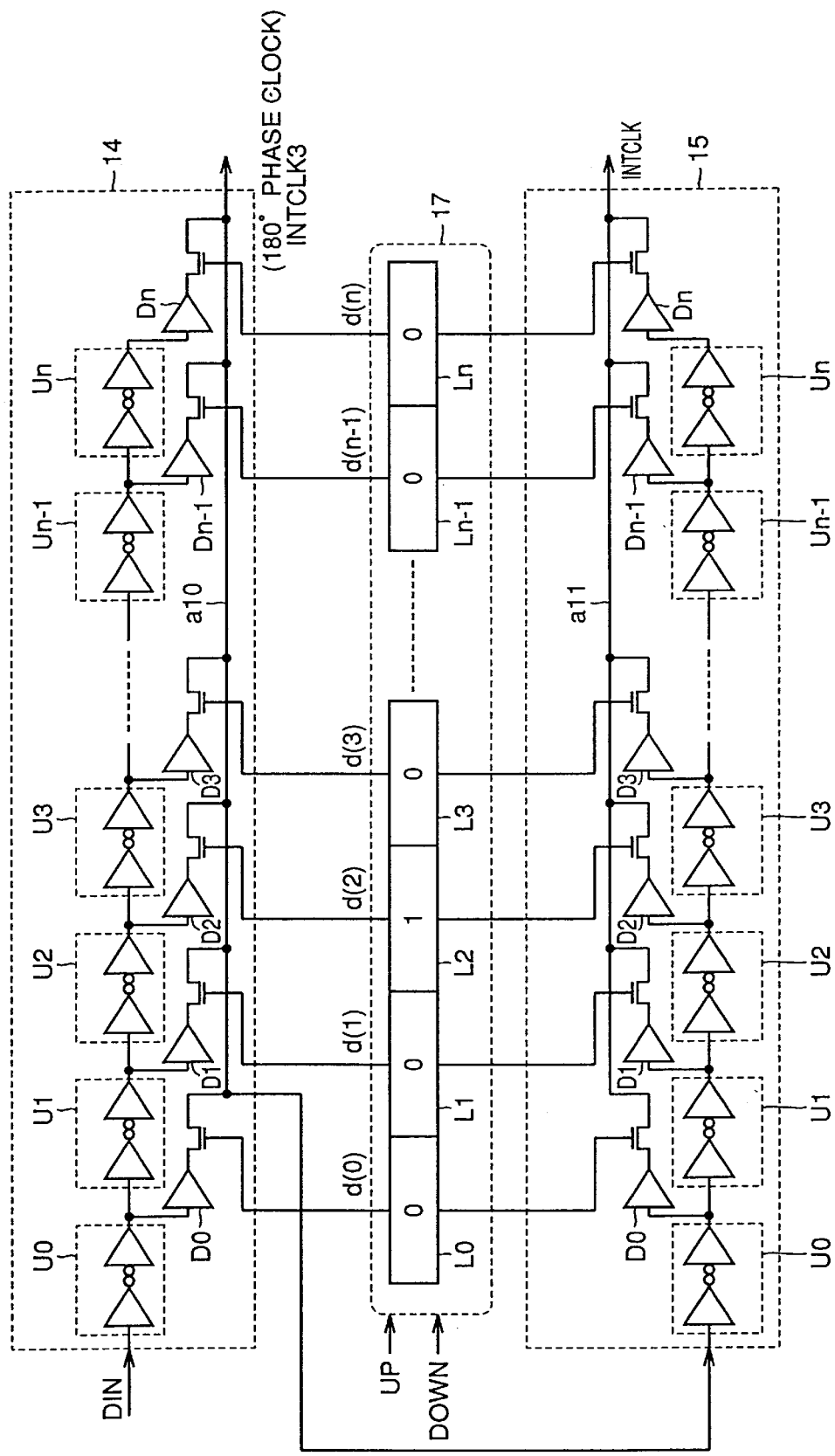
FIG. 23 is a schematic diagram showing a basic structure of delay line 12.

In the figure, portions common to those of the conventional DLL circuit 900 shown in FIG. 17 are denoted by the same reference characters and description thereof is not repeated.

Figure 1:
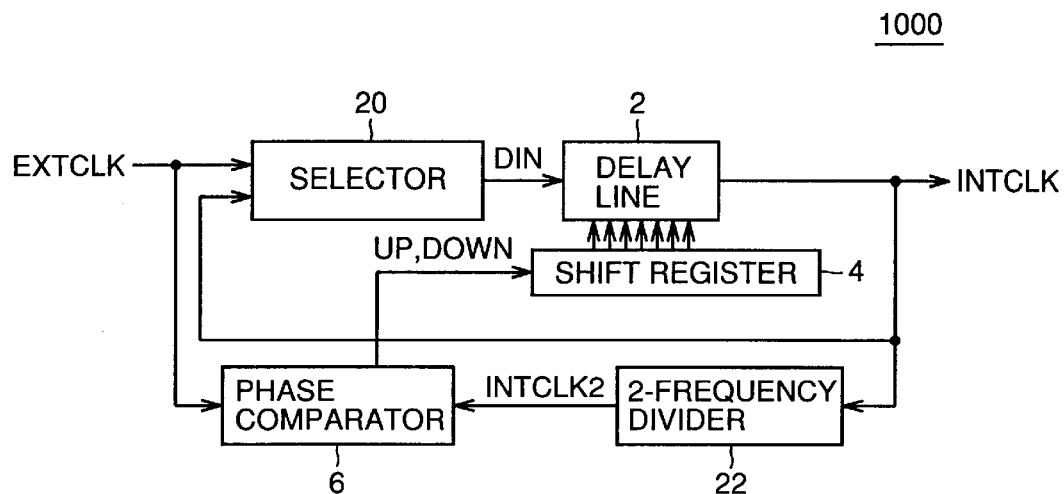
FIG. 1 is a schematic block diagram showing a basic structure of a DLL circuit 1000 in accordance with the first embodiment of the present invention.

Referring to FIG. 1, DLL circuit 1000 in accordance with the first embodiment of the present invention includes delay line 2, shift register 4, phase comparator 6, a selector 20 and a 2-frequency divider 22.

Selector 20 receives at its inputs, external clock signal EXTCLK and internal clock signal INTCLK output from delay line 2, and selects and outputs either one of these (hereinafter the output is referred to as clock signal DIN).

Delay line 2 receives clock signal DIN output from selector 20 at its input, and delays the same to provide internal clock signal INTCLK.

2-frequency divider 22 receives at its input internal clock signal INTCLK, frequency dividing the same and outputs the result (hereinafter referred to as clock signal INTCLK 2).

Phase comparator 6 compares the phase of external clock signal EXTCLK with the phase of clock signal INTCLK 2 output from 2-frequency divider 22, and as a result of comparison, outputs a DOWN signal or an UP signal.

Shift register 4 controls delay time of delay line 2 based on the DOWN signal or the UP signal output from phase comparator 6.

The structure of selector 20 will be described with reference to the circuit diagram of FIG. 2.

Figure 2:
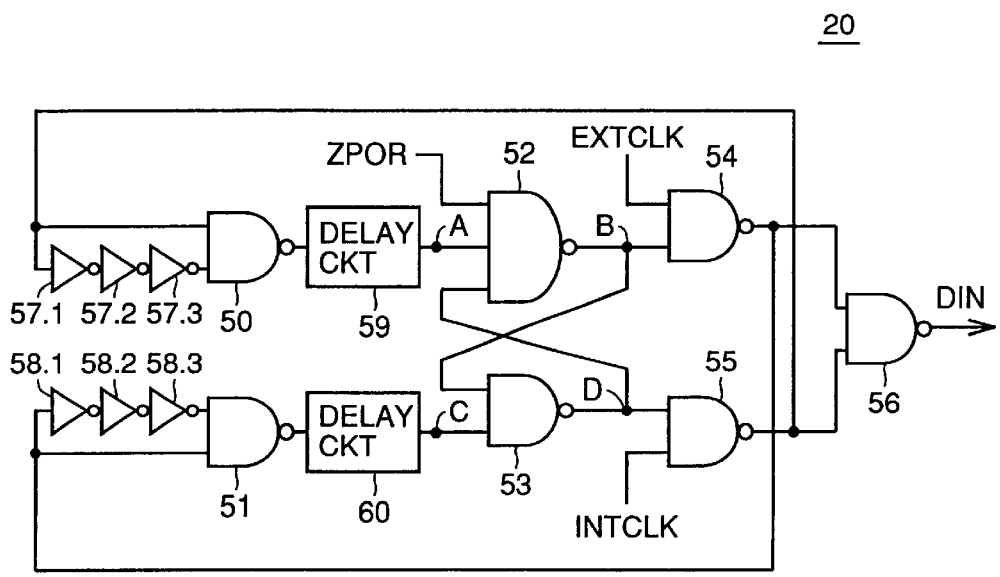
FIG. 2 is a schematic diagram showing an example of a specific structure of a selector 20 in accordance with the first embodiment of the present invention.

Referring to FIG. 2, selector 20 includes NAND circuits 50, 51, 52, 53, 54, 55 and 56, delay circuits 59 and 60, inverter circuits 57.1, 57.2 and 57.3, and inverter circuits 58.1, 58.2 and 58.3.

Delay circuit 59 receives at its input an output signal from NAND circuit 50. Delay circuit 60 receives at its input an output signal from NAND circuit 51.

NAND circuit 52 receives at a first input node, a signal of an output node (node A) of delay circuit 59. NAND circuit 52 receives at a second input node, a signal at an output node (node D) of NAND circuit 53. Further, NAND circuit 52 receives at a third input node, a signal ZPOR which is an initializing signal.

NAND circuit 53 receives at a first input node, a signal at an output node (node C) of delay circuit 60. NAND circuit 53 receives at a second input node, a signal at an output node (node B) of NAND circuit 52.

Here, the signal ZPOR is used for resetting internal nodes when the power is turned on. More specifically, immediately after power on, the signal is set to the L level and then set to the H level after a prescribed time period. Therefore, at the time of initialization (power on), node B is set to the H level, while node D is set to the L level.

NAND circuit 54 receives at its inputs external clock signal EXTCLK and a signal at node B. NAND circuit 55 receives at its inputs internal clock signal INTCLK and a signal at node D. NAND circuit 56 receives at its inputs an output from NAND circuit 54 and an output from NAND circuit 55, and outputs clock signal DIN.

When node B is at the H level, for example, external clock signal EXTCLK is selected, and based on the external clock signal EXTCLK, the clock signal DIN is generated. Meanwhile, when node D is at the H level, internal clock signal INTCLK is selected and the clock signal DIN is generated based on internal clock signal INTCLK.

Inverter circuits 58.1, 58.2 and 58.3 are connected in series. Inverter circuit 58.1 receives at its input an output signal from NAND circuit 54. NAND circuit 51 receives at its inputs, an output signal from NAND circuit 54 and an output signal from inverter circuit 58.3.

Inverter circuits 57.1, 57.2 and 57.3 are connected in series. Inverter 57.1 receives at its input an output signal from NAND circuit 55. NAND circuit 50 receives at its inputs an output signal from NAND circuit 55 and an output signal from inverter circuit 57.3.

By NAND circuit 50 and inverter circuits 57.1, 57.2 and 57.3, a one shot pulse is generated at node A dependent on the output from NAND circuit 55. By NAND circuit 51 and inverter circuits 58.1, 58.2 and 58.3, a one shot pulse is generated at node C dependent on the output signal from NAND circuit 54.

The operation of selector 20 shown in FIG. 2 will be described with reference to timing charts of FIGS. 3A to 3H.

Referring to FIGS. 3A to 3H, at time t0 (initialization), signal ZPOR is set to the L level. Consequently, node B attains to the H level and node D attains to the L level. Accordingly, external clock signal EXTCLK is set to the selected state. Thereafter, signal ZPOR is set to the H level.

Consequently, when the external clock signal EXTCLK at the H level reaches NAND circuit 54 at time t1, clock signal DIN is output in response to external clock signal EXTCLK. Next, at time t2, when external clock signal EXTCLK falls to the L level, a one shot pulse of L level is generated at node C at the falling edge of this signal.

As a result, node D attains to the H level while node B attains to the L level. Therefore, internal clock signal INTCLK is set to the selected state.

Therefore, at time t3, when internal clock signal INTCLK at the H level reaches NAND circuit 55, clock signal DIN is output in response to internal clock signal INTCLK.

Thereafter, at time t4, when internal clock signal INTCLK falls to the L level, a one shot pulse at the L level is generated at node A at the falling edge of this signal.

As a result, node B attains to the H level and node D attains to the L level. Therefore, external clock signal EXTCLK is set to the selected state.

In this manner, selector 20 in accordance with the first embodiment selects external clock signal EXTCLK and internal clock signal INTCLK alternately, and outputs the selected signal as clock signal DIN.

The structure of 2-frequency divider 22 in accordance with the first embodiment of the present invention will be described with reference to the circuit diagram of FIG. 4.

Figure 4:
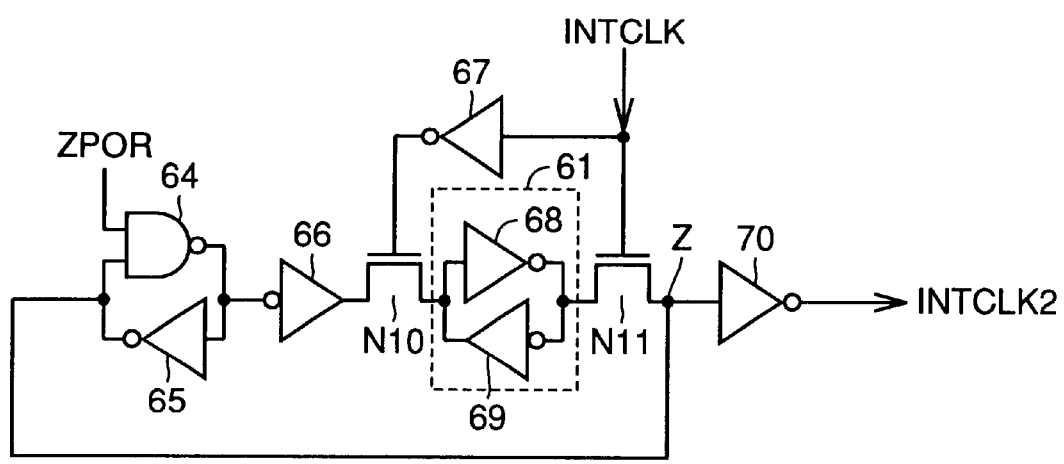
FIG. 4 is a schematic diagram showing an example of a specific structure of a 2-frequency divider 22 in accordance with the first embodiment of the present invention.

Referring to FIG. 4, 2-frequency divider 22 includes an NAND circuit 64, inverter circuits 65, 66, 67, 68, 69 and 70, and NMOS transistors N10 and N11.

Inverter circuits 68 and 69 constitute a latch circuit 61. NMOS transistor N10 is connected between inverter circuit 66 and latch circuit 61. NMOS transistor N11 is connected between latch circuit 61 and a node Z (an input node of inverter circuit 70). The clock signal INTCLK 2 is output from inverter circuit 70.

NAND circuit 64 receives at a first input node, the signal ZPOR. NAND circuit 64 has a second input node connected to node Z. An output node of inverter circuit 65 is connected to node Z. An output node of NAND circuit 64 and an input node of inverter circuit 65 are connected to an input node of inverter circuit 66.

As already described, the signal ZPOR is set to the L level immediately after power on, and set to the H level after a prescribed time period. Therefore, at the time of initialization (power on), node Z is set to the L level state, and therefore clock signal INTCLK 2 is precharged to the H level.

Inverter circuit 67 receives at its input the internal clock signal INTCLK and inverts the same. NMOS transistor N10 receives at the gate electrode, an output signal from inverter circuit 67. NMOS transistor N11 receives at the gate electrode, the internal clock signal INTCLK.

When internal clock signal INTCLK is at the H level, NMOS transistor N11 is rendered conductive, and NMOS transistor N10 is rendered non-conductive. Here, the potential of node Z changes in accordance with the potential of an output node of inverter circuit 68 (or an input node of inverter circuit 69) constituting latch circuit 61. Further in response, the potential of clock signal INTCLK 2 changes.

When internal clock signal INTCLK is at the L level, NMOS transistor N10 is rendered conductive, and NMOS transistor N11 is rendered non-conductive. Here, when the signal ZPOR is at the H level, the potential at the output node of inverter circuit 68 (or the input node of inverter circuit 69) constituting latch circuit 61 attains a potential which is an inversion of the potential at node Z.

The operation of 2-frequency divider 22 shown in FIG. 4 will be described with reference to the timing charts of FIGS. 5A to 5C.

Figure 5:
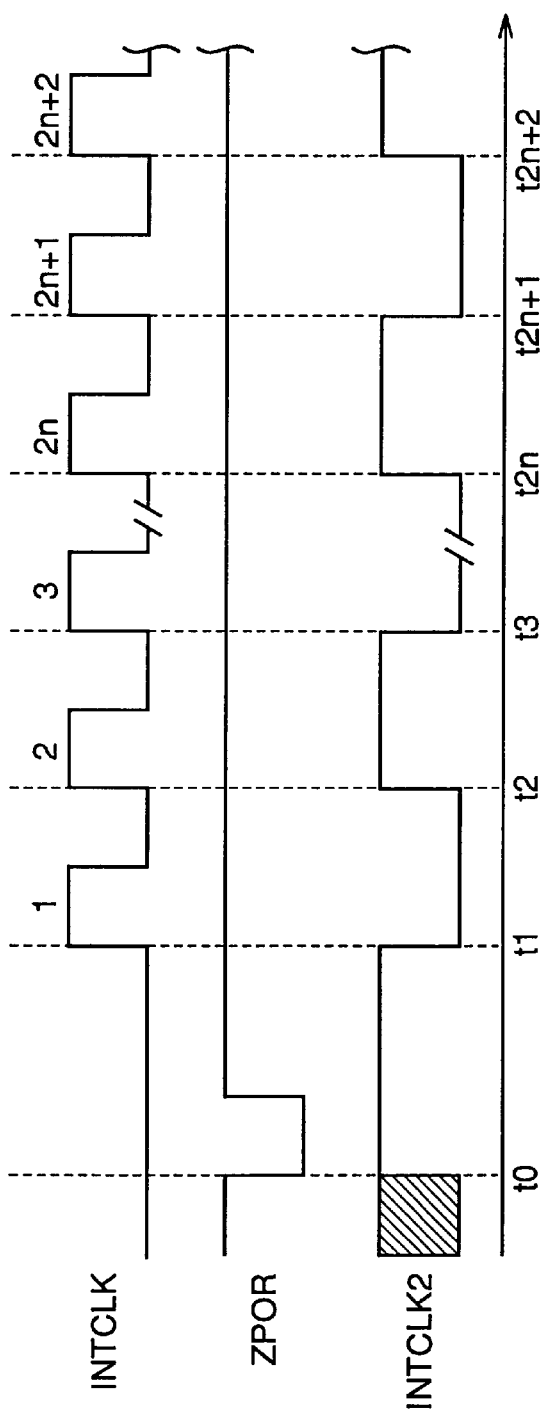
FIGS. 5A to 5C are timing charts showing the operation of 2-frequency divider 22 in accordance with the first embodiment of the present invention.

As shown in FIGS. 5A to 5C, at time t0 (initialization), signal ZPOR is set to the L level. Consequently, the potential at node Z is set to the L level and, in response, clock signal INTCLK 2 is precharged to the H level.

Thereafter, signal ZPOR is set to the H level. Consequently, the potential at the output node of inverter circuit 68 attains to the H level.

Thereafter, at time t1, when the first internal clock signal INTCLK rises to the H level, at the time of rise to the H level, the potential at node Z changes to the H level. In response, clock signal INTCLK 2 falls to the L level.

Thereafter, when the first internal clock signal INTCLK falls to the L level, the potential of the output node of inverter circuit 68 attains to the L level in response.

Thereafter, at time t2, when the second internal clock signal INTCLK rises to the H level, at the time of rise to the H level, the potential at node Z changes to the L level. In response, clock signal INTCLK 2 rises to the H level.

Thereafter, when the second internal clock signal INTCLK falls to the L level, the potential at the output node of inverter circuit 68 attains to the H level in response. Thereafter, in the similar manner, at the time of 2nth (where n is an integer larger than 1) rise of the internal clock signal INTCLK, clock signal INTCLK 2 rises to the H level.

At the 2n+1th rise of the internal clock signal INTCLK, the signal INTCLK 2 falls to the L level.

In this manner, by frequency divider 22 in accordance with the first embodiment, clock signal INTCLK 2 is output, which signal is obtained by dividing the frequency of internal clock signal INTCLK by 2.

The structure of phase comparator 6 will be described with reference to the circuit diagram of FIG. 6.

Figure 6:
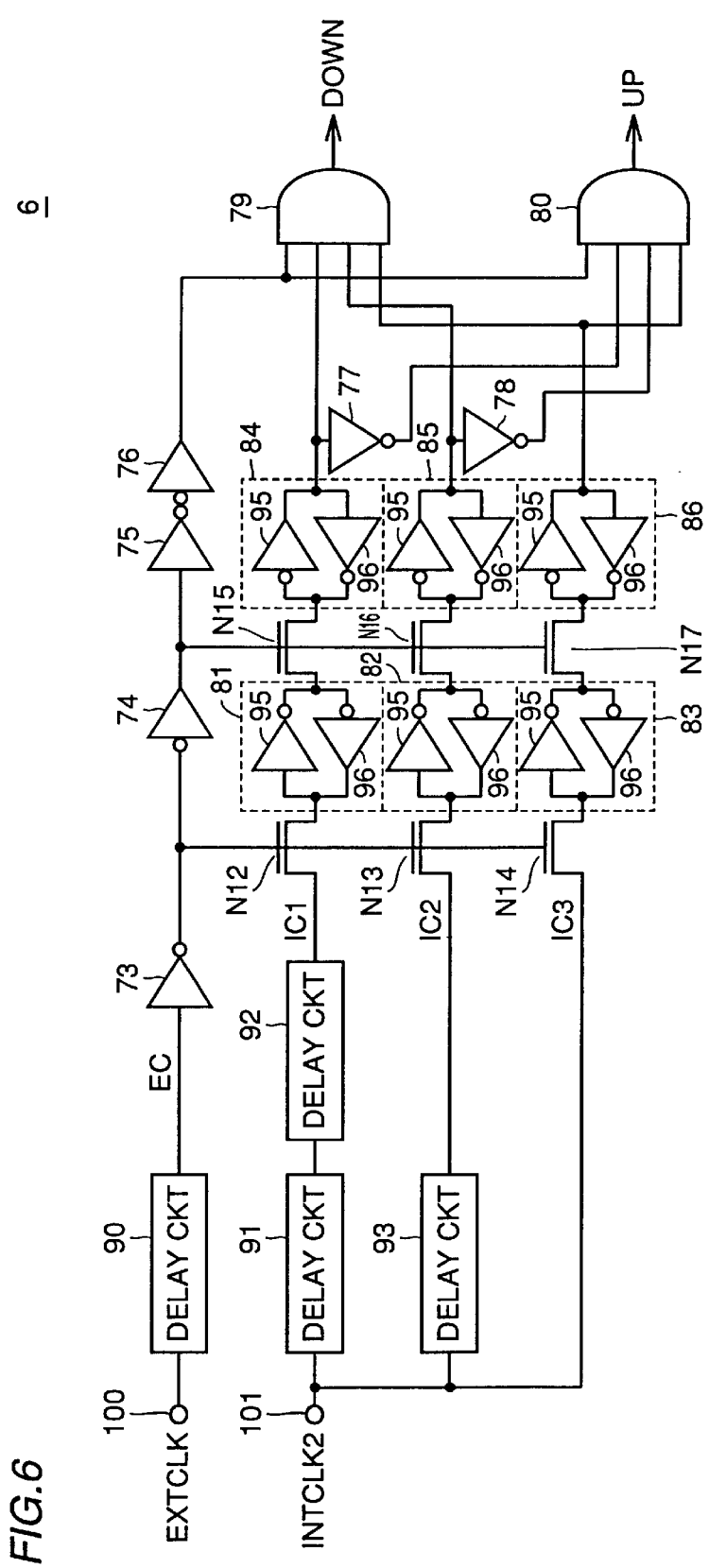
FIG. 6 is a schematic diagram showing an example of a specific structure of a phase comparator 6 in accordance with the first embodiment of the present invention.
Figure 7:
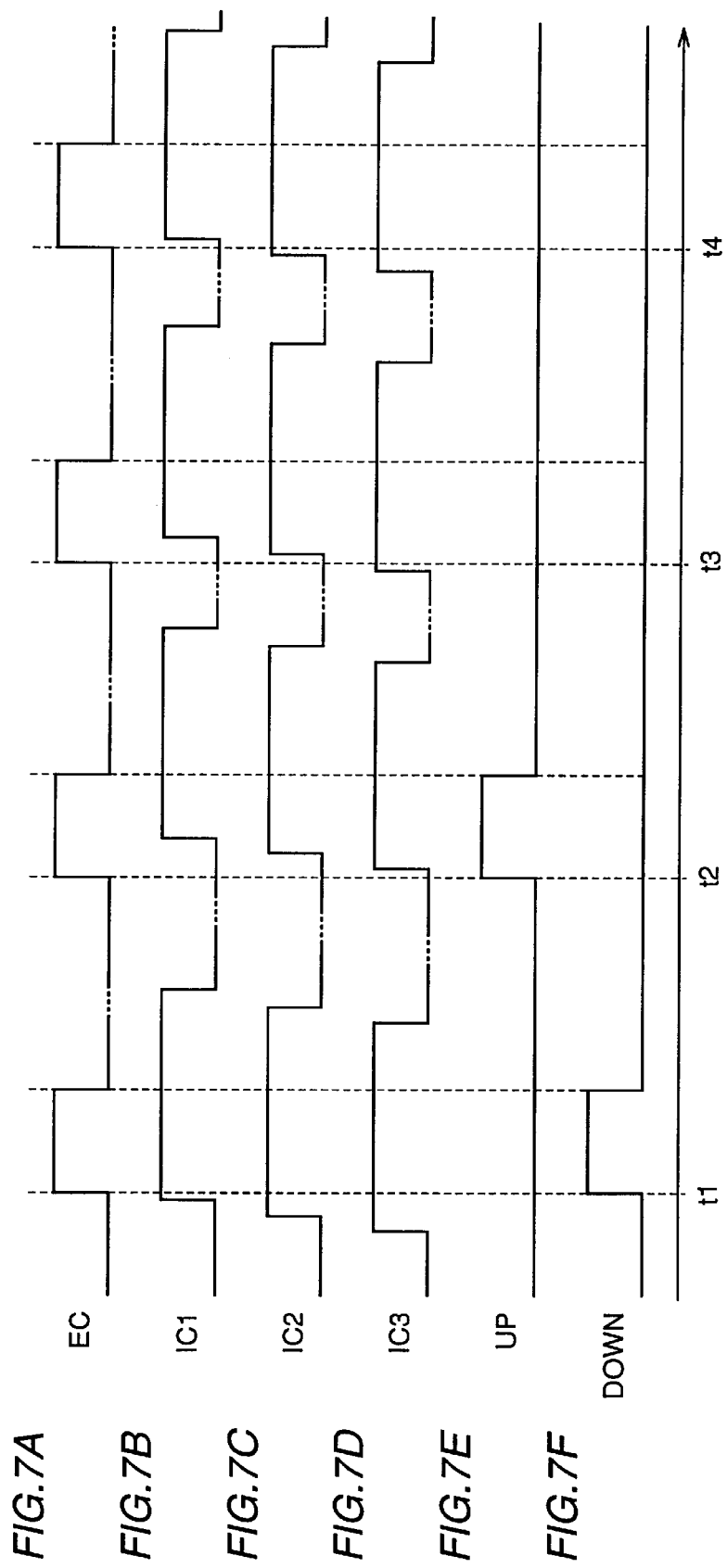
FIGS. 7A to 7F are timing charts showing the operation of phase comparator 6 in accordance with the first embodiment of the present invention.
Figure 8:
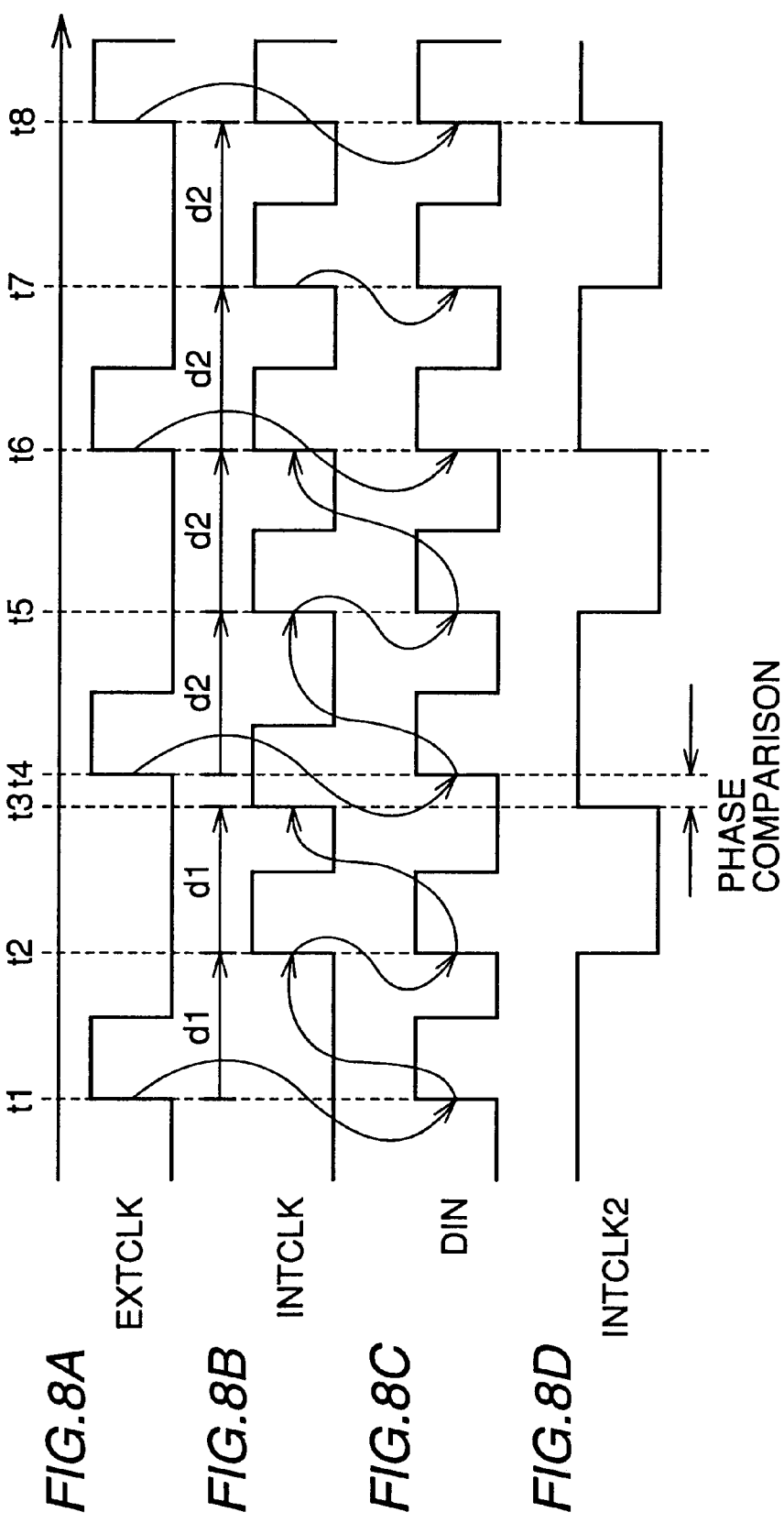
FIGS. 8A to 8D are timing charts showing the operation of DLL circuit 1000 in accordance with the first embodiment of the present invention.

Referring to FIG. 6, phase comparator 6 includes delay circuits 90, 91, 92 and 93, inverter circuits 73, 74, 75, 76, 77 and 78, AND circuits 79 and 80, latch circuits 81, 82, 83, 84, 85 and 86, and NMOS transistors N12, N13, N14, N15, N16 and N17.

Delay circuit 90 receives a signal at input node 100, delays the same and outputs the result (hereinafter, the resulting signal will be referred to as clock signal EC). Delay circuit 91 receives a signal at an input node 101, delays the same and outputs the result. Delay circuit 92 receives an output signal from delay circuit 91, delays the same and outputs the result (the resulting signal will be referred to as clock signal IC1). Delay circuit 93 receives a signal at input node 101, delays the same and outputs the result (hereinafter, the resulting signal will be referred to as clock signal IC2).

Input node 100 receives external clock signal EXTCLK, and input node 101 receives clock signal INTCLK 2, respectively.

Inverters 73, 74, 75 and 76 are connected in series. Inverter circuit 73 receives at an input, clock signal EC. Inverter circuit 76 has its output node connected to a first input node of AND circuit 79 and to a first input node of AND circuit 80.

NMOS transistor N12 is connected between delay circuit 92 and latch circuit 81. NMOS transistor N15 is connected between latch circuits 81 and 84.

NMOS transistor N13 is connected between delay circuit 93 and latch circuit 82. NMOS transistor N16 is connected between latch circuits 82 and 85.

NMOS transistor N14 is connected between input node 101 and latch circuit 83. NMOS transistor N17 is connected between latch circuits 83 and 86.

NMOS transistors N12, N13 and N14 have respective gate electrodes connected to an output node of inverter circuit 73. NMOS transistors N15, N16 and N17 have respective gate electrodes connected to an output node of inverter circuit 74.

Latch circuits 81, 82, . . . , 86 each include inverter circuits 95 and 96. Inverter circuit 77 inverts a signal at an output node of inverter circuit 95 (input node of inverter circuit 96) constituting latch circuit 84. Inverter circuit 78 inverts a signal at an output node of inverter circuit 95 (input node of inverter circuit 96) constituting latch circuit 85.

AND circuit 79 has a second input node connected to an output node of inverter 95 (input node of inverter circuit 96) constituting latch circuit 84. AND circuit 79 has a third input node connected to the output node of inverter circuit 95 (input node of inverter circuit 96) constituting latch circuit 85. AND circuit 79 has a fourth input node connected to the output node of inverter circuit 95 (input node of inverter circuit 96) constituting latch circuit 86.

AND circuit 80 has a second input node connected to an output node of inverter circuit 77. AND circuit 80 has third input node connected to an output node of inverter circuit 78. AND circuit 80 has a fourth input node connected to the output node of inverter circuit 95 (input node of inverter circuit 96) constituting latch circuit 86.

DOWN signal is output from AND circuit 79, and UP signal is output from AND circuit 80, respectively. Here, assume that delay circuits 90, 91, 92 and 93 each have the delay time of td0. More specifically, clock signal EC is delayed by td0 from external clock signal EXTCLK. Clock signal IC1 is delayed by 2×td0 from clock signal INTCLK 2. Further, clock signal IC2 is delayed by td0 from clock signal INTCLK 2. For simplicity, in the following, a signal received at one conduction terminal of NMOS transistor N14 (that is, clock signal INTCLK 2) will be referred to as clock signal IC3.

Phase comparator 6 compares the phase of each of the clock signals IC1, IC2 and IC3 with the phase of clock signal EC, and outputs the DOWN signal or UP signal accordingly.

Operation of phase comparator 6 shown in FIG. 6 will be described with reference to the timing charts of FIGS. 7A to 7F.

First, an example in which the phase of clock signal INTCLK 2 is advanced by more than the prescribed delay time td0 from the phase of external clock signal EXTCLK (point t1 of FIG. 7) will be described.

In this case, at the rise of clock signal EC (at time t1), clock signals IC1, IC2 and IC3 are all at the H level. Therefore, the DOWN signal at the H level is output from AND circuit 79 which receives at all input nodes, H level signals.

Next, an example where the phase of clock signal INTCLK is delayed by more than the prescribed delay time td0 from the phase of external clock signal EXTCLK (at point t2 of FIG. 7) will be described.

In this case, at the rise of clock signal EC (at point t2), clock signals IC1, IC2 and IC3 are all at the L level. Therefore, the UP signal at the H level is output from AND circuit 80 which receives at all the input nodes, the H level signals.

Next, operation when phase difference between clock signal INTCLK 2 and external clock signal EXTCLK is within a prescribed delay time (±td0) (points t3 and t4 of FIG. 7) will be described.

In this case, at the rise of clock signal EC (point T3 or T4), any one of clock signals IC1, IC2 and IC3 is at the H level and any one is at the L level. Therefore, in this state, neither the UP signal nor the DOWN signal is generated.

The state in which neither the UP signal nor the DOWN signal is generated will be referred to as non-sensitive band.

By providing such a non-sensitive band, a so-called chattering in which the UP and DOWN signals are generated repeatedly can be avoided. The time period of the non-sensitive band is set to be not shorter than the delay time of delay unit U of delay line 2 described above. By such setting, it becomes possible to prevent repeated generation of the UP and DOWN signals when the phase difference is subtle.

In this manner, phase comparator 6 in accordance with the first embodiment outputs the DOWN signal or UP signal controlling shift register 4, based on the phase difference between external clock signal EXTCLK and the clock signal INTCLK 2 output from 2-frequency divider 22.

As described above, shift register 4 adjusts delay time of delay line 2 receiving DOWN signal or UP signal. More specifically, when the DOWN signal at the H level is received, delay time is made longer, and when the UP signal at the H level is received, delay time is made shorter.

Based on the description above, the operation of DLL circuit 1000 in accordance with the first embodiment of the present invention will be described with reference to the timing charts of FIGS. 8A to 8D.

Here, delay time of delay line 2 at the time of initialization is assumed to be d1.

At time t1, selector 20 selectively takes in the external clock signal EXTCLK and outputs it as clock signal DIN.

In response, delay line 2 outputs the first internal clock signal INTCLK at time t2 (=t1+d1).

Clock signal INTCLK output from 2-frequency divider 22 falls to the L level at the rising edge of the first internal clock signal INTCLK (at point t2).

Selector 20 selectively takes in the first internal clock signal INTCLK and outputs it as clock signal DIN.

In response, delay line 2 outputs the second internal clock signal INTCLK at time t3 (=t2+d1).

The clock signal INTCLK 2 output from 2-frequency divider 22 rises to the H level at the rising edge of the second internal clock signal INTCLK (at point t3).

Phase comparator 6 receives the clock signal INTCLK 2 at the H level at point t3. Further, phase comparator 6 receives the external clock signal EXTCLK at the H level at a delayed time point of t4.

Here, since there is phase difference between clock signal INTCLK 2 and external clock signal EXTCLK, delay time of delay line 2 is adjusted (here, delay time d2).

Selector 20 selectively takes in the external clock signal EXTCLK received at point t4, and outputs it as clock signal DIN.

In response, delay line 2 outputs the third internal clock signal INTCLK at point t5 (=t4+d2).

The clock signal INTCLK 2 output from 2-frequency divider 22 falls to the L level at the rising edge of the third internal clock signal INTCLK (at pint t5).

Selector 20 selectively takes in the third internal clock signal INTCLK and outputs it as clock signal DIN.

In response, delay line 2 outputs the fourth internal clock signal INTCLK at point t6 (=t5+d2).

In this manner, in DLL circuit 1000 in accordance with the first embodiment, based on the result of phase comparison between external clock signal EXTCLK and the clock signal INTCLK 2 obtained by dividing internal clock signal INTCLK by 2, delay time of delay line 2 is determined.

Based on the determined delay time, external clock signal EXTCLK is delayed to be the 2n+1th internal clock signal INTCLK (where n is an integer not smaller than 1). Further, the 2n+1th internal clock signal INTCLK is fed back and delayed by the same delay time to be the 2n+2th internal clock signal INTCLK.

Therefore, when the internal clock signal INTCLK and the external clock signal EXTCLK are in phase with each other (from t6 to t8 of FIG. 8), the 5th internal clock signal INTCLK which rises at point t7 and the 6th internal clock signal INTCLK which rises at point t8 would be signals transmitted through the delay line 2 of the same state.

As a result, the internal clock signal INTCLK corresponds to the external clock signal EXTCLK multiplied by 2. Further, internal clock signal INTCLK at time t7 is a clock pulse having phase difference of 180° without any skew with respect to external clock signal EXTCLK.

Further, the clock signal INTCLK 2 obtained by frequency division of the internal clock INTCLK signal would be a clock signal having the duty ratio of 50% where the width of H level and the width of the L level are both equal to the delay time (d2) of the delay line 2.

Here, since the circuit is adapted to generate multiplied signals with the internal clock signal passed through the same delay line, highly accurate multiplied signal can be generated, different from the prior art.

Second Embodiment

DLL circuit in accordance with a second embodiment of the present invention will be described in the following.

The DLL circuit in accordance with the second embodiment of the present invention enables generation of an internal clock signal of which frequency is the frequency of external clock signal multiplied by 2/n (where n is an integer not smaller than 3).

The structure of the DLL circuit in accordance with the second embodiment will be described with reference to the schematic block diagram of FIG. 9.

In the figure, components similar to those of DLL circuit 1000 shown in FIG. 1 are denoted by the same reference characters and description thereof is not repeated.

Figure 9:
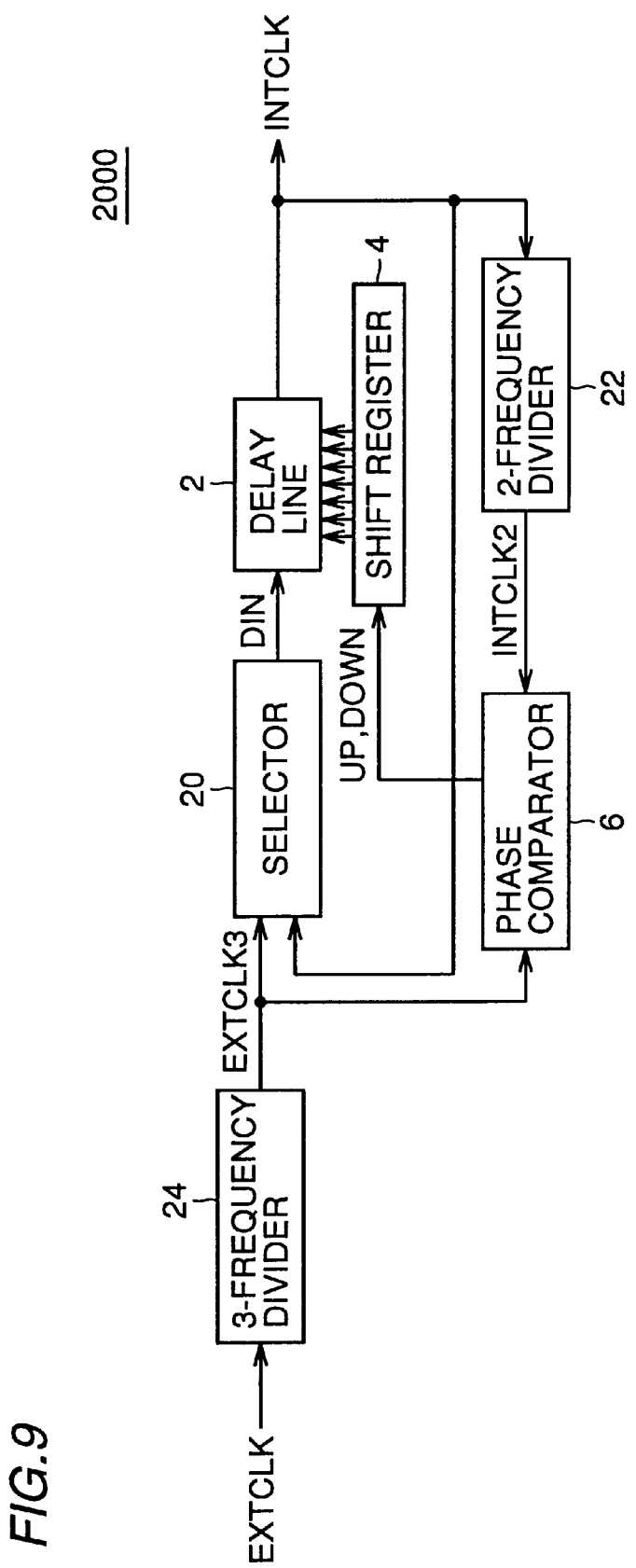
FIG. 9 is a schematic block diagram showing a specific structure of a DLL circuit 2000 in accordance with a second embodiment of the present invention.

Referring to FIG. 9, DLL circuit 200 differs from DLL circuit 1000 shown in FIG. 1 in that it further includes a 3-frequency divider 24 for dividing external clock signal EXTCLK by 3.

3-frequency divider receives the external clock signal EXTCLK and outputs clock signal EXTCLK 3 of which frequency is divided by 3. Selector 20 selectively outputs clock signal EXTCLK 3 and internal clock signal INTCLK alternately. Phase comparator 6 compares phases of the clock signal EXTCLK 3 and of the clock signal INTCLK 2 output from 2-frequency divider 22. Based on the result of comparison, delay time of delay line 2 is adjusted.

Structure of the 3-frequency divider 24 in accordance with the second embodiment will be described with reference to the circuit diagram of FIG. 10.

Figure 10:
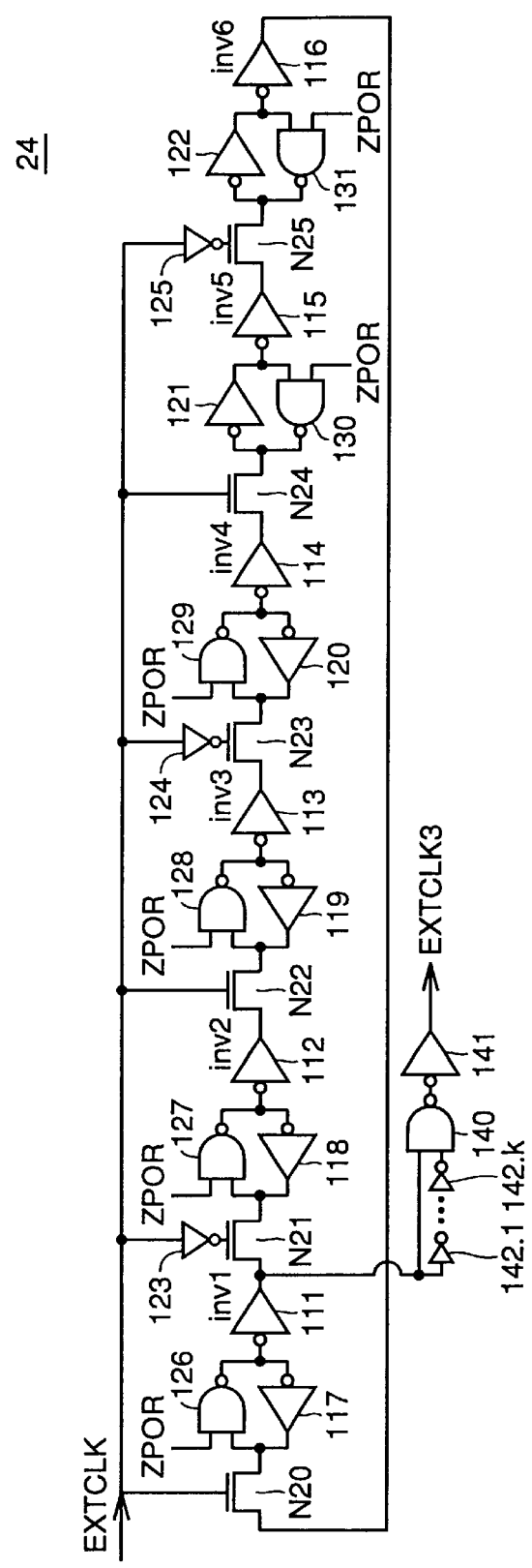
FIG. 10 is a schematic diagram showing an example of a specific structure of a 3-frequency divider 24 in accordance with the second embodiment of the present invention.

Referring to FIG. 10, 3-divider 24 includes NMOS transistors N20, N21, ..., N25, inverter circuits 111, 112, ..., 125 and NAND circuits 126, 127, ..., 131.

NMOS transistors N20, N22 and N24 receive at respective gate electrodes, the external clock signal EXTCLK. NMOS transistors N21, N23 and N25 receive at respective gate electrodes, inverted external clock signal EXTCLK inverted by the corresponding inverter circuits 123, 124 and 125.

Therefore, in response to external clock signal EXTCLK, when NMOS transistors N20, N22 and N24 are rendered conductive (non-conductive), then NMOS transistors N21, N23 and N25 are rendered non-conductive (conductive).

NAND circuits 126,127, ..., 131 each receive at a first input node, the signal ZPOR.

NMOS transistor N20 is connected between an output node of inverter circuit 116 and a second input node of NAND circuit 126. The second input node of NAND circuit 126 is further connected to an output node of inverter circuit 117. An output node of NAND circuit 126 and an input node of inverter circuit 117 are connected to an input node of inverter circuit 111.

NMOS transistor N21 is connected between an output node of inverter circuit 111 and the second input node of NAND circuit 127. The second input node of NAND circuit 127 is further connected to an output node of inverter circuit 118. An output node of NAND circuit 127 and an input node of inverter circuit 118 are connected to an input node of inverter circuit 112.

NMOS transistor N22 is connected between an output node of inverter circuit 112 and a second input node of NAND circuit 128. The second input node of NAND circuit 128 is further connected to an output node of inverter circuit 119. An output node of NAND circuit 128 and an input node of inverter circuit 119 are connected to an input node of inverter circuit 113.

NMOS transistor N23 is connected between an output node of inverter circuit 113 and a second input node of NAND circuit 129. The second input node of NAND circuit 129 is further connected to an output node of inverter circuit 120. An output node of NAND circuit 129 and an input node of inverter circuit 120 are connected to an input node of inverter circuit 114.

NMOS transistor N24 is connected between an output node of inverter circuit 114 and an output node of NAND circuit 130. The output node of NAND circuit 130 is further connected to an input node of inverter circuit 121. A second input node of NAND circuit 130 and an output node of inverter circuit 121 are connected to an input node of inverter circuit 115.

NMOS transistor N25 is connected between an output node of inverter circuit 115 and an output node of NAND circuit 131. The output node of NAND circuit 131 is further connected to an input node of inverter circuit 122. A second input node of NAND circuit 131 and an output node of inverter circuit 122 are connected to an input node of inverter circuit 116.

For simplicity, in the following, signals at output nodes of inverter circuits 111, 112, 113, 114, 115 and 116 will be denoted by the reference characters inv1, inv2, inv3, inv4, inv5 and inv6, respectively.

These signals satisfy the following relation. More specifically, when NMOS transistor N20 is rendered conductive, signal inv1 changes in response to signal inv6. When NMOS transistor N22 is rendered conductive, signal inv3 changes in response to signal inv2. When NMOS transistor N24 is rendered conductive, signal inv5 changes in response to signal inv4.

Meanwhile, when NMOS transistor N21 is rendered conductive, signal inv2 changes in response to signal inv1. When NMOS transistor N23 is rendered conductive, signal inv4 changes in response to signal inv3. When NMOS transistor N25 is rendered conductive, signal inv6 changes in response to signal inv5.

3-frequency divider 24 further includes an NAND circuit 140, inverter circuit 141 and inverter circuits 142.1, 142.2, ..., 142.k (where k is an odd number).

Inverter circuits 142.1, 142.2, ..., 142.k are connected in series. Inverter circuit 142.1 receives signal inv1 which is an output from inverter circuit 111. NAND circuit 140 receives at a first input node, the signal inv1, at the second input node, an output from inverter circuit 142.k. Inverter circuit 141 receives and inverts an output from NAND circuit 140.

By NAND circuit 140 and inverter circuits 142.1, 142.2, ..., 142.k, a one shot pulse of L level is generated in response to the signal inv1. In response, a one shot pulse (clock signal EXTCLK 3) of H level is output from inverter circuit 141.

The operation of 3-frequency divider 24 shown in FIG. 10 will be describe with reference to the flow charts of FIGS. 11A to 11I.

The signal ZPOR is once set to the L level at the time of power on and after a prescribed time period, set to the H level, as described above.

As shown in FIGS. 11A to 11I, at time t0 (initialization), the signal ZPOR is set to the L level. Consequently, signals inv5 and inv6 are set to the H level, and signals inv1, inv2, inv3 and inv4 are set to the L level. Thereafter, the signal ZPOR is set to the H level.

Thereafter, at time t1, when external clock signal EXTCLK rises to the H level, then in response to the H level signal inv6, signal inv1 rises to the H level. Meanwhile, in response to the L level signal inv4, the signal inv5 falls to the L level.

At time t1, when the signal inv1 rises to the H level, a one shot pulse of H level is generated (clock signal EXTCLK 3).

Thereafter, at time t2, when external clock signal EXTCLK falls to the L level, in response to the H level signal inv1, the signal inv2 rises to the H level. Meanwhile, in response to the L level signal inv5, the signal inv6 falls to the L level.

Thereafter, at time t3, when the external clock signal EXTCLK rises to the H level, in response to the H level signal inv2, the signal inv3 rises to the H level. Meanwhile, in response to the L level signal inv6, the signal inv1 falls to the L level.

Thereafter, at time t4, when the external clock signal EXTCLK falls to the L level, in response to the H level signal inv3, the signal inv4 rises to the H level. Meanwhile, in response to the L level signal inv1, the signal inv2 falls to the L level.

Thereafter, at time t5, when the external clock signal EXTCLK rises to the H level, in response to the H level signal inv4, the signal inv5 rises to the H level. Meanwhile, in response to the L level signal inv2, the signal inv3 falls to the L level.

Thereafter, at time t6, when the external clock signal EXTCLK falls to the L level, in response to the H level signal inv5, the signal inv6 rises to the H level. Meanwhile, in response to the L level signal inv3, the signal inv4 falls to the L level.

At time t7, when the external clock signal EXTCLK rises to the H level, in response to the H level signal inv6, the signal inv1 rises to the H level. Meanwhile, in response to the L level signal inv4, the signal inv5 falls to the L level.

At time t7, when the signal inv1 rises to the H level, a one shot pulse at the H level (clock signal EXTCLK 3) is generated.

Thereafter, at time t8, when the external clock signal EXTCLK falls to the L level, in response to the H level signal inv1, the signal inv2 rises to the H level. Meanwhile, in response to the L level signal inv5, the signal inv6 falls to the L level.

Figure 11:
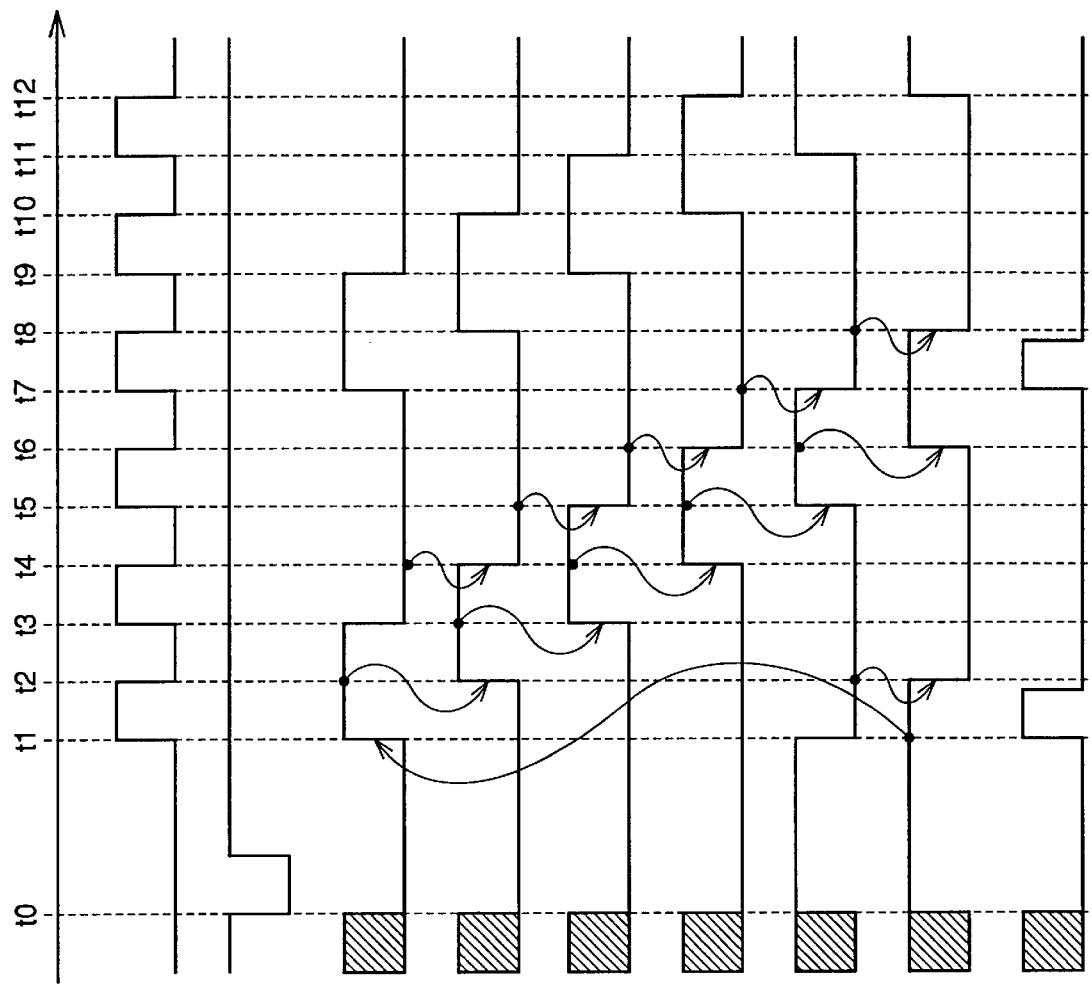
FIGS. 11A to 11I are timing charts showing the operation of 3-frequency divider 24 in accordance with the second embodiment of the present invention.
Figure 12:
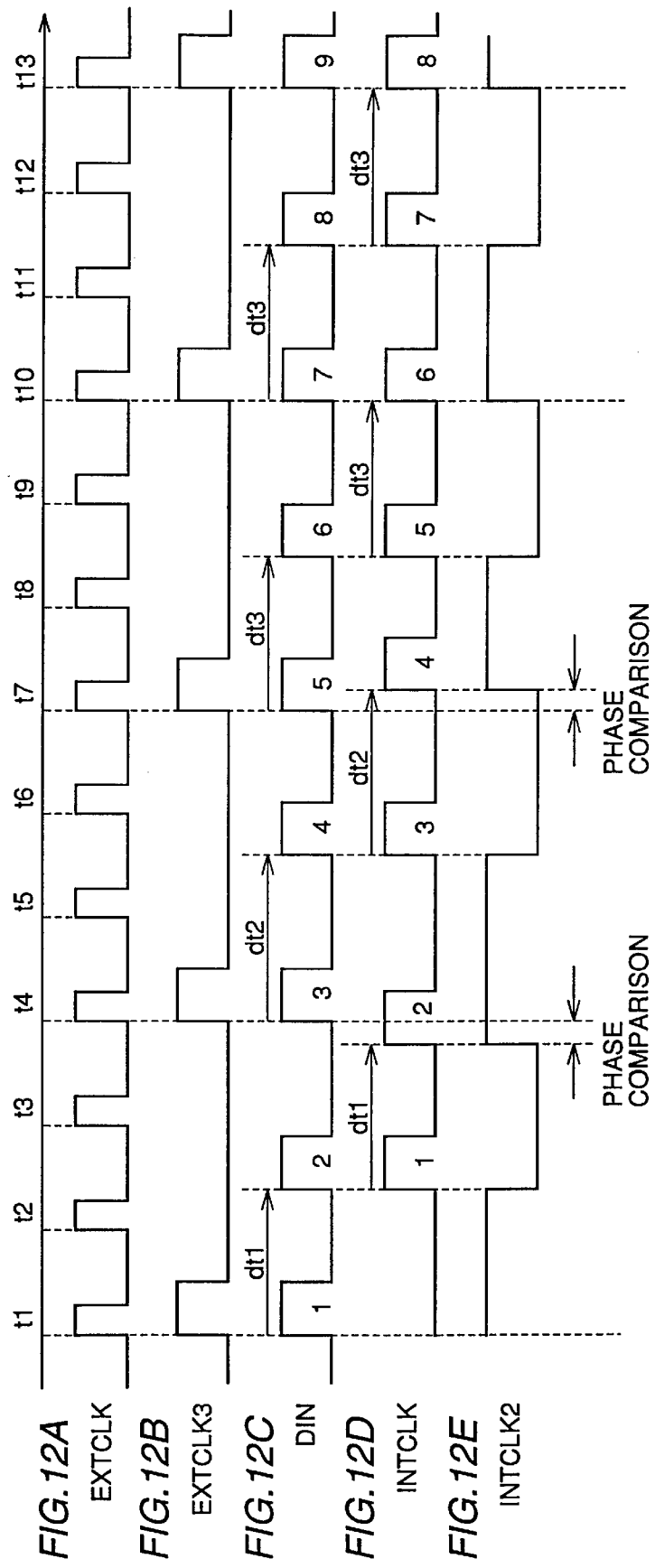
FIGS. 12A to 12E are timing charts showing the operation of DLL circuit 2000 in accordance with the second embodiment of the present invention.

More specifically, in FIG. 11, the signal inv1 attains to the H level at time point t(6n+1) (where n is an integer not smaller than 0). The signal inv1 attains to the L level at time point t(6n+3).

In this manner, 3-frequency divider 24 in accordance with the second embodiment generates a pulse signal (clock signal EXTCLK 3) once in every three periods of external clock signal EXTCLK.

In view of the foregoing, the operation of DLL circuit 2000 in accordance with the second embodiment of the present invention will be described with reference to the timing charts of the FIGS. 12A to 12E.

Here, delay time of delay line 2 at the time of initialization is assumed to be dt1.

Assume that the external clock signal EXTCLK is input at time points t1, t2, . . . , as shown in FIGS. 12A to 12E. Therefore, the clock signal EXTCLK 3 is output from 3-frequency divider 24 at time points t1, t4, t7, . . .

At time t1, selector 20 selectively takes in the clock signal EXTCLK 3, and outputs the first clock signal DIN. Accordingly, delay line 2 outputs the first internal clock signal INTCLK after the lapse of dt1 from time point t1.

The clock signal INTCLK 2 output from 2-frequency divider 22 falls to the L level at the timing of rise of the first internal clock signal INTCLK.

Selector 20 selectively takes in the first internal clock signal INTCLK and outputs the second clock signal DIN. Consequently, delay line 2 outputs the second internal clock signal INTCLK after the laps of dt1 from the timing of rise of the second clock signal DIN.

The clock signal INTCLK 2 output from 2-frequency divider 22 rises to the H level at the timing of rise of the second internal clock signal INTCLK.

Phase comparator 6 compares phases of the clock signal INTCLK 2 and of the clock signal EXTCLK 3 which rises to the H level at t4. Based on the result of comparison, delay time of delay line 2 is adjusted (here, the delay time is denoted by the reference character dt2).

Selector 20 selectively takes in the clock signal EXTCLK 3 at time t4, and outputs the third clock signal DIN. Consequently, delay line 2 outputs the third internal clock signal INTCLK after the lapse of dt2 from point t4.

The clock signal INTCLK 2 output from 2-frequency divider 22 falls to the L level at the timing of rise of the third internal clock signal INTCLK.

Selector 20 selectively takes in the third internal clock signal INTCLK, and outputs the fourth clock signal DIN. Consequently, delay line 2 outputs the fourth internal clock signal INTCLK after the lapse of dt2 from the timing of rise of the fourth clock signal DIN.

The clock signal INTCLK 2 output from 2-frequency divider 22 rises to the H level at the timing of rise of the fourth internal clock signal INTCLK.

Phase comparator 6 compares phases of clock signal INTCLK 2 and of the clock signal EXTCLK 3 which rises to the H level at time t7, and delay time of delay line 2 is adjusted (delay time here is denoted by dt3), based on the result of comparison.

Thereafter, when clock signals EXTCLK 3 and INTCLK 2 are in phase with each other (from time point t10 and after), the clock signal DIN output from selector 2 would be output delayed by the delay time dt3 over delay line 2.

In this manner, in DLL circuit 2000 in accordance with the second embodiment, delay time of delay line 2 is determined based on the result of comparison between phases of the clock signal EXTCLK 3 obtained by dividing external clock signal EXTCLK by 3 and of the clock signal INTCLK 2 obtained by dividing internal clock signal INTCLK by 2. Selector 20 outputs selectively and alternately the clock signal EXTCLK 3 and the internal clock signal INTCLK to delay line 2.

As a result, the frequency of the internal clock signal INTCLK is $2/3$ times the frequency of the external clock signal EXTCLK. The clock signal INTCLK 2 obtained by dividing internal clock signal INTCLK would be a clock signal having the duty ratio of 50% of which H level width and L level width are both equal to the delay time (dt3) of delay line 2.

From the foregoing, it is understood that DLL circuit 2000 in accordance with the second embodiment of the present invention is capable of readily generating internal clock signal INTCLK of which frequency is ⅔ times that of the external clock signal and which is in phase with the external clock signal.

Further, the clock signal INTCLK 2 obtained by frequency-dividing internal clock signal INTCLK is an accurate clock signal having the duty ratio of 50%.

Though an internal clock signal in phase with and having ⅔ times the frequency of the external clock signal is generated by dividing the external clock signal by 3 in the foregoing, it is only an example and an internal clock signal of which frequency is 2/n times can readily be generated by using an n-frequency divider (where n is an integer not smaller than 3).

Third Embodiment

The DLL circuit in accordance with a third embodiment of the present invention will be described in the following.

The DLL circuit in accordance with the third embodiment of the present invention is capable of generating a signal which is a multiplication of the external clock signal, and capable of shifting phase of the generated multiplied signal.

The structure of DLL circuit 3000 in accordance with the third embodiment of the present invention will be described with reference to the schematic block diagram of FIG. 13.

In the figure, components similar to those of the conventional DLL circuit 900 shown in FIG. 17 or to those of DLL circuit 1000 shown in FIG. 1 are denoted by the same reference characters and description thereof is not repeated.

Figure 13:
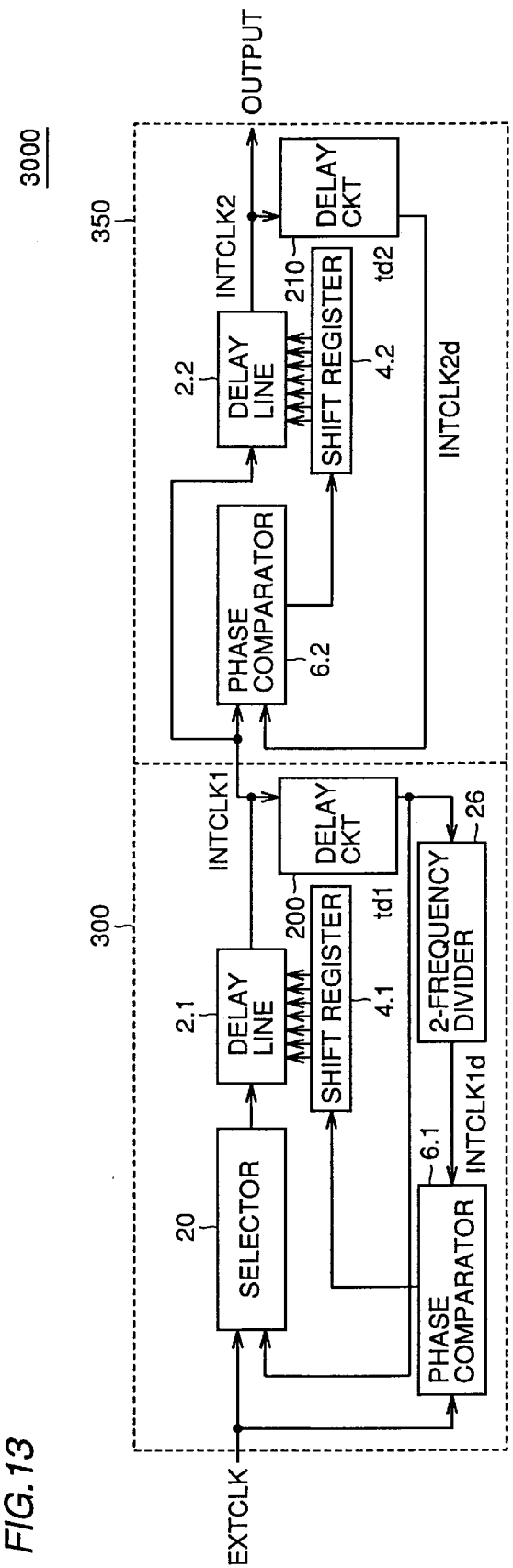
FIG. 13 is a schematic block diagram showing an example of a basic structure of a DLL circuit 3000 in accordance with a third embodiment of the present invention.
Figure 14:
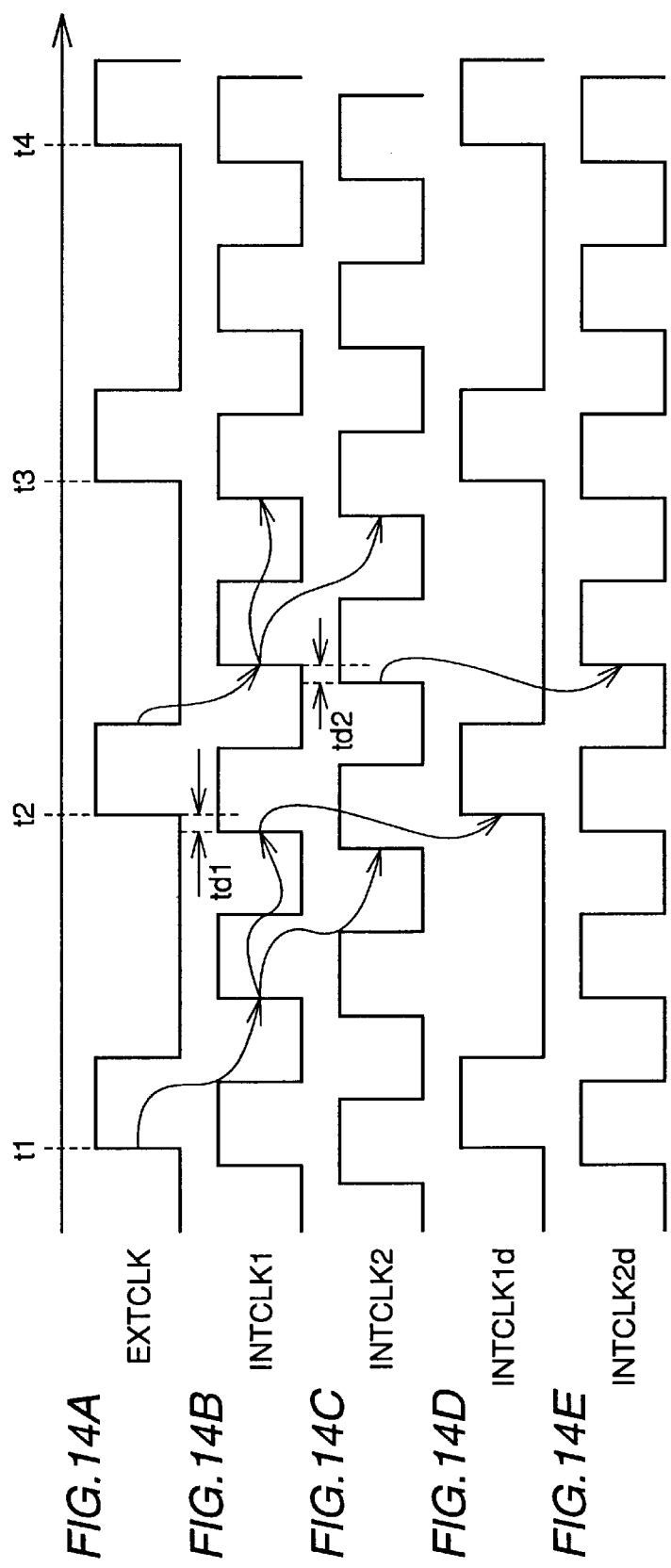
FIGS. 14A to 14E are timing charts showing the operation of DLL circuit 3000 in accordance with the third embodiment of the present invention.

Referring to FIG. 13, DLL circuit 3000 includes clock generating circuits 300 and 350. Clock generating circuit 300 receives the external clock signal EXTCLK and outputs the first internal clock signal INTCLK 1. Clock generating circuit 350 receives the first internal clock signal INTCLK 1 and outputs the second internal clock signal INTCLK 2.

First, structure of clock generating circuit 300 will be described.

Clock generating circuit 300 includes a delay line 2.1, a shift register 4.1, a phase comparator 6.1, a 2-frequency divider 26, selector 20 and a delay circuit 200. Delay line 2.1, shift register 4.1 and phase comparator 6.1 have the same structures as delay line 2, shift register 4 and phase comparator 6 shown in FIG. 1, respectively.

Delay line 2.1 delays an input signal and outputs the first internal clock signal INTCLK 1. Delay circuit 200 delays the first internal clock signal INTCLK 1. 2-frequency divider 26 generates a clock signal INTCLK 1d by frequency-dividing by 2 an output signal from delay circuit 200.

2-frequency divider 26 may have, for example, the structure of 2-frequency divider 22 shown in FIG. 4. 2-frequency divider 26 is initialized at the time of power on by a reset signal (signal ZPOR).

Selector 20 alternately selects the external clock signal EXTCLK and an output signal from delay circuit 200 and outputs the selected one to delay line 2.1. Selector 20 is initialized at the time of power on by the reset signal (signal ZPOR).

Phase comparator 6.1 compares phases of external clock signal EXTCLK and of clock signal INTCLK 1d, and based on the result of comparison, outputs the DOWN signal or UP signal. Shift register 4.1 adjusts the delay time of delay line 2.1 based on the DOWN signal or UP signal.

As already described, the first internal clock signal INTCLK 1 is the external clock signal EXTCLK multiplied by 2. Further, the first internal clock signal INTCLK 1 is a clock pulse having a prescribed phase difference with reference to external clock signal EXTCLK.

Structure of clock generating circuit 350 will be described.

Clock generating circuit 350 includes a delay line 2.2, a shift register 4.2, a phase comparator 6.2 and a delay circuit 210. Delay line 2.2, shift register 4.2 and phase comparator 6.2 have same structures as delay line 2, shift register 4 and phase comparator 6 shown in FIG. 1, respectively.

Delay line 2.2 receives the first internal clock signal INTCLK 1 output from clock generating circuit 300, delays the same and outputs the result (the second internal clock signal INTCLK 2). Delay circuit 210 delays the second internal clock signal INTCLK 2 (hereinafter the delayed signal will be referred to as clock signal INTCLK 2d).

Phase comparator 6.2 compares phases of the first internal clock signal INTCLK 1 and of the clock signal INTCLK 2d, and outputs the DOWN signal or the UP signal based on the result of comparison. Shift register 4.2 adjusts the delay time of delay line 2.2 based on the DOWN signal or the UP signal.

Here, the second internal clock signal INTCLK 2 would be a clock pulse having a prescribed phase difference with respect to the first internal clock signal INTCLK 1.

The operation of DLL circuit 3000 in accordance with the third embodiment of the present invention will be described with reference to the timing charts of FIGS. 14A to 14E. Basic operation of clock generating circuit 300 is the same as that of DLL circuit 1000 shown in FIG. 1. The basic operation of clock generating circuit 350 is the same as DLL circuit 900 shown in FIG. 17.

Assume that delay time of delay circuit 200 is td1 and the delay time of delay circuit 210 is td2.

Referring to FIGS. 14A to 14E, the external clock signal EXTCLK is input to DLL circuit 3000 at time points t1, t2, . . . .

At time t1, when DLL circuit 3000 receives the external clock signal EXTCLK, clock generating circuit 300 outputs the first internal clock signal INTCLK 1.

Clock generating circuit 350 delays the first internal clock signal INTCLK 1 and outputs the second internal clock signal INTCLK 2. Clock generating circuit 300 feeds back and delays the first internal clock signal INTCLK 1, and outputs a new first internal clock signal INTCLK 1.

2-frequency divider 26 outputs, based on the new first internal clock signal INTCLK 1, a clock signal INTCLK 1d.

At time t2, when DLL circuit 3000 receives the external clock signal EXTCLK, phase comparator 6.1 detects phase difference between external clock signal EXTCLK and clock signal INTCLK 1d (and when phase difference is not 0 here, delay time of delay line 2.1 is adjusted so that the phase difference is set to 0).

In the shown example, phase difference is 0, and difference in timing of rise between the external clock signal EXTCLK and the first internal clock signal INTCLK 1 is td1 (delay time of delay circuit 200).

Meanwhile, clock generating circuit 350 delays the first internal clock signal INTCLK 1 and outputs the second internal clock signal INTCLK 2.

Delay circuit 210 outputs a clock signal INTCLK 2d based on the second internal clock signal INTCLK 2.

Phase comparator 6.2 detects phase difference between the first internal clock signal INTCLK 1 and the clock signal INTCLK 2d (and when difference is not 0 here, delay time of delay line 2.2 is adjusted so that the phase difference is set to 0).

In the shown example, the phase difference is 0, and difference in timing of rise between the first internal clock signal INTCLK 1 and the second internal clock signal INTCLK 2 is td2 (delay time of delay circuit 210).

In this manner, in DLL circuit 3000, feedback operation takes place so that phase difference between the external clock signal EXTCLK and the clock signal INTCLK 1d is made 0 and that phase difference between the first internal clock signal INTCLK 1 and the clock signal INTCLK 2d is made 0.

In DLL circuit 1000 in accordance with the first embodiment, when an external clock signal having the frequency of 100 MHz is input, a clock signal having the frequency multiplied by 2, that is, having the frequency of 200 MHz is generated. Therefore, the phase of the signal could be pulled back by up to 5 ns, which is the period of 200 MHz. In other words, in DLL circuit 1000, phase can be pulled back only up to the period of the multiplied frequency.

By contrast, in the DLL circuit 3000 in accordance with the third embodiment, the phase can be pulled back to 1.5 times the frequency of the external clock signal, because of the structure described above.

Fourth Embodiment

A DLL circuit in accordance with the fourth embodiment of the present invention will be described in the following.

The DLL circuit in accordance with the fourth embodiment of the present invention is capable of generating a clock signal having multiplied frequency of the external clock signal, capable of changing the phase of the generated multiplied clock signal, and further capable of suppressing jitter (fluctuation) of phase.

The structure of DLL circuit 4000 in accordance with the fourth embodiment will be described with reference to the schematic block diagram of FIG. 15.

Components similar to those of the conventional DLL circuit 900 shown in FIG. 17 or similar to those of DLL circuit 3000 shown in FIG. 13 are denoted by the same reference characters and description thereof is not repeated.

Figure 15:
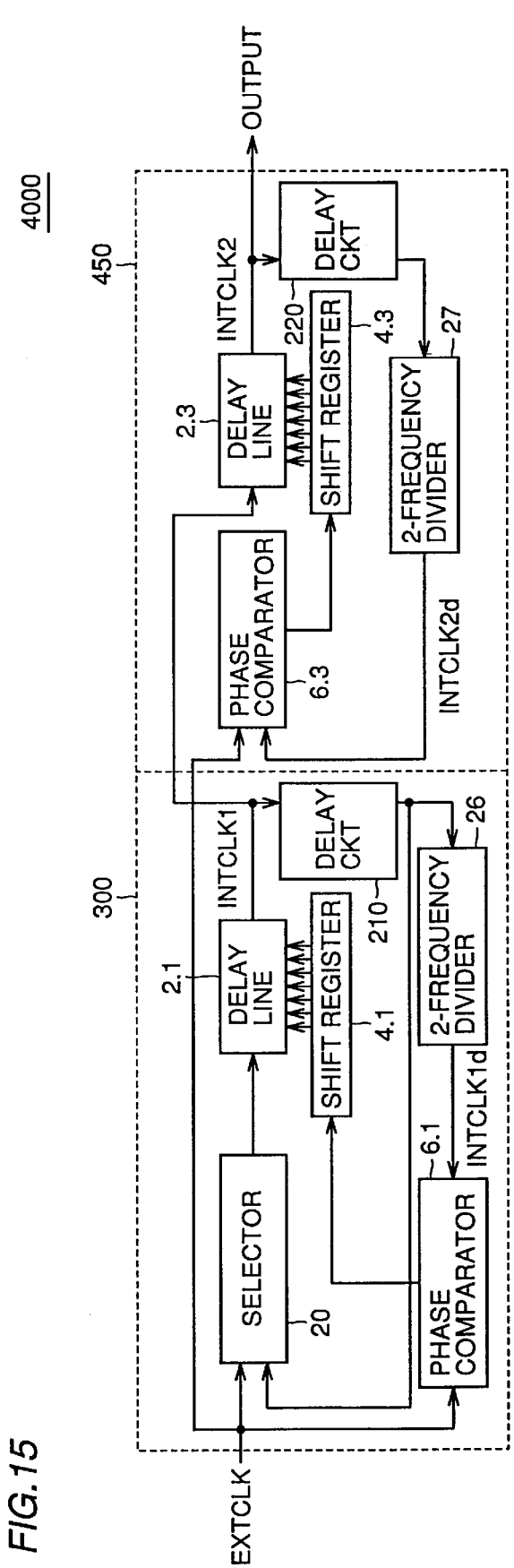
FIG. 15 is a schematic block diagram showing an example of a basic structure of a DLL circuit 4000 in accordance with a fourth embodiment of the present invention.

Referring to FIG. 15, DLL circuit 4000 includes clock generating circuit 300 and a clock generating circuit 450.

The structure of clock generating circuit 450 will be described in the following.

Clock generating circuit 450 includes a delay line 2.3, a shift register 4.3, a phase comparator 6.3, a 2-frequency divider 27, and a delay circuit 220. Delay line 2.3, shift register 4.3 and phase comparator 6.3 have same structures as delay line 2, shift register 4 and phase comparator 6 shown in FIG. 1, respectively.

Delay line 2.3 delays the first internal clock signal INTCLK 1 and outputs the second internal clock signal INTCLK 2. Delay circuit 220 delays the second internal clock signal INTCLK 2.

2-frequency divider 27 generates a clock signal INTCLK 2d by frequency-dividing by 2 the output signal from delay circuit 220. 2-frequency divider 27 may have a structure, for example, of 2-frequency divider 22 shown in FIG. 4. 2-frequency divider 27 is initialized at the time of power on by the reset signal (signal ZPOR).

Phase comparator 6.3 compares phases of external clock signal EXTCLK and of clock signal INTCLK 2d, and outputs the DOWN signal or UP signal based on the result of comparison. Shift register 4.3 adjusts delay time of delay line 2.3 based on the DOWN signal or UP signal.

More specifically, clock generating circuit 450 adjusts the delay time of delay line 2.3 such that phase difference between the external clock signal EXTCLK and the clock signal INTCLK 2d is made 0.

The operation of DLL circuit 4000 in accordance with the fourth embodiment of the present invention will be described with reference to the timing charts of FIGS. 16A to 16E.

Here, delay time of delay circuit 200 is represented as td1 and delay time of delay circuit 220 is represented as td2.

Figure 16:
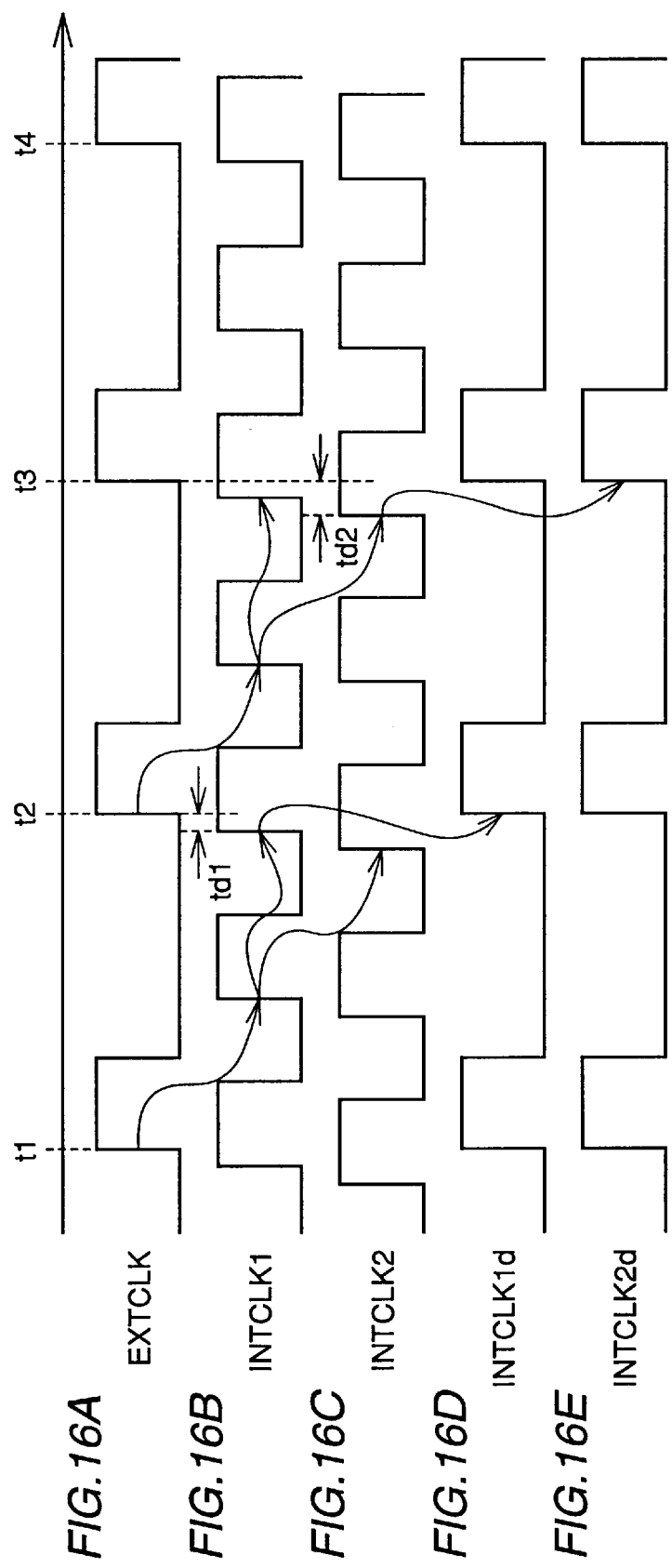
FIGS. 16A to 16E are timing charts showing the operation of DLL circuit 4000 in accordance with the fourth embodiment of the present invention.

As shown in FIG. 16A, external clock signal EXTCLK is input to DLL circuit 4000 at time points t1, t2, . . .

At time t1, when the external clock signal EXTCLK is input, clock generating circuit 300 generates the first internal clock signal INTCLK 1.

Clock generating circuit 450 delays the first internal clock signal INTCLK 1 and outputs the second internal clock signal INTCLK 2. Clock generating circuit 300 feeds back and delays the first internal clock signal INTCLK 1 and outputs a new first internal clock signal INTCLK 1.

2-frequency divider 26 outputs a clock signal INTCLK 1d based on the first internal clock signal INTCLK 1.

Phase comparator 6.1 detects phase difference between external clock signal EXTCLK (input at time point t2) and clock signal INTCLK 1d (and when phase difference is not 0 here, delay time of delay line 2.1 is adjusted to make phase difference 0).

At time point t2, in this example, phase difference is 0, and difference in timing of rise between the external clock signal EXTCLK and the first internal clock signal INTCLK 1 is td1 (delay time of delay circuit 200).

At time t2, when external clock signal EXTCLK is input, clock generating circuit 300 outputs the first internal clock signal INTCLK 1.

Clock generating circuit 450 delays the first internal clock signal INTCLK 1 and outputs the second internal clock signal INTCLK 2. Clock generating circuit 300 feeds back and delays the first internal clock signal INTCLK 1 and outputs a new first internal clock signal INTCLK 1.

Delay circuit 220 delays the second internal clock signal INTCLK 2. 2-frequency divider 27 outputs clock signal INTCLK 2d based on an output signal from delay circuit 220.

Phase comparator 6.3 detects phase difference between the external clock signal EXTCLK (input at time point t3) and the clock signal INTCLK 2d (and if phase difference is not 0 here, delay time of delay line 2.3 is adjusted to make phase difference 0).

In the shown example, phase difference is 0 at time t3, and difference in timing of rise of the external clock signal EXTCLK and the second internal clock signal INTCLK 2 is td2 (delay time of delay circuit 220).

More specifically, in DLL circuit 3000 described above, clock generating circuit 350 positioned in the succeeding stage performs phase comparison referring to the first internal clock signal INTCLK 1 output from clock generating circuit 300 positioned in the preceding stage and as a result, jitters (fluctuations) of these two clock generating circuits (300 and 350) are summed.

By contrast, in DLL circuit 4000 in accordance with the fourth embodiment, clock generating circuit 450 positioned in the succeeding stage performs phase comparison referring to the external clock signal EXTCLK. Therefore, influence of the jitter can be suppressed and more precise internal clock signal can be generated.

As described above, by the internal clock signal generating circuit in accordance with the present invention, an internal clock signal which is a multiplication of the external clock signal, can be generated by feeding back an internal clock signal synchronized in phase with the external clock signal to a delay line of the same state.

Further, by frequency dividing the internal clock signal, a clock signal having duty ratio of 50% can be generated.

Further, since means for frequency-dividing the external clock signal is provided, it is possible to generate an internal clock signal synchronized in phase with the external clock signal and having the frequency 2/n times that of the external clock signal.

Further, by the internal clock signal generating circuit in accordance with the present invention, it is possible to generate a signal which is a multiplication of the external clock signal and to shift the phase of the generated multiplied signal, as the circuit includes a clock generating circuit capable of generating an internal clock signal which is a multiplication of the external clock signal provided in a preceding stage and another clock generating circuit different from that in the preceding stage.

Further, by the internal clock signal generating circuit in accordance with the present invention, as it is provided with a clock generating circuit generating an internal clock signal which is a multiplication of the external clock signal is provided in a preceding stage and another clock generating circuit different from that of the preceding stage and performing phase comparison referring to the external clock signal provided in a succeeding stage, highly precise internal clock signal can be generated while suppressing influence of jitter generated in the circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An internal clock signal generating circuit for generating an internal clock signal synchronized in phase with an external clock signal, comprising:
    a delay line for delaying an input signal and outputting said internal clock signal;
    selecting means for selectively outputting to said delay line one of the internal clock signal output from said delay line and said external clock signal;
    first frequency dividing means for frequency-dividing said internal clock signal; and
    delay control means for detecting a phase difference between a signal output from said first frequency dividing means and said external clock signal, and for controlling the delay time of the delay line based on a result of said detection.

2. The internal clock signal generating circuit according to claim 1 wherein ;
    said selecting means alternately selects and outputs to said delay line said external clock signal and said internal clock signal;
    said first frequency dividing means divides frequency of said internal clock signal by 2; and
    said external clock signal is first selected by the selecting means.

3. The internal clock signal generating circuit according to claim 1, further comprising
    second frequency dividing means for frequency-dividing the external clock signal and outputting a result to said selecting means and said delay control means.

4. The internal clock signal generating circuit according to claim 1 wherein
    said delay control means adjusts the delay time of said delay line so that said phase difference is within a prescribed range.

5. The internal clock signal generating circuit according to claim 3, wherein
    said delay control means adjusts the delay time of said delay line so that said phase difference is within a prescribed range.

6. An internal clock signal generating circuit, comprising:
    first clock signal generating means for generating, based on an external clock signal, a first internal clock signal synchronized in phase with said external clock signal; and
    second clock signal generating means for generating, based on the first internal clock signal output from said first clock signal generating means, a second internal clock signal synchronized in phase with said first internal clock signal;
    said first clock signal generating means including
    a first delay line for delaying an input signal and outputting said fist internal clock signal,
    selecting means for selectively outputting to said first delay line one of the first internal clock signal output from said first delay line and said external clock signal,
    frequency dividing means for frequency-dividing said first internal clock signal, and
    first delay control means for detecting a phase difference between a signal output from said frequency-dividing means and said external clock signal, and for controlling the delay time of said first delay line based on a result of the detection; and
    said second clock signal generating means including
    a second delay line for delaying said first internal clock signal and outputting said second internal clock signal, and
    second delay control means for detecting a phase difference between the second internal clock signal output from said second delay line and said first internal clock signal, and for controlling the delay time of said second delay line based on a result of the detection.

7. The internal clock signal generating circuit according to claim 6, wherein
    said selecting means alternately selects and outputs to said first delay line said external clock signal and said first internal clock signal;
    said frequency dividing means divides frequency of said first internal clock signal by 2; and
    said external clock signal is first selected by said selecting means.

8. The internal clock signal generating circuit according to claim 7, wherein
    said first delay control means adjusts the delay time of said first delay line so that said phase difference is within a first prescribed range; and
    said second delay control means adjusts the delay time of said second delay line so that said phase difference is within a second prescribed range.

9. An internal clock signal generating circuit, comprising:
    first clock signal generating means for generating, based on an external clock signal, a first internal clock signal synchronized in phase with said external clock signal; and
    second clock signal generating means for generating, based on the first internal clock signal output from said first clock signal generating means, a second internal clock signal synchronized in phase with said external clock signal;
    wherein said first clock signal generating means includes
    a first delay line for delaying an input signal and outputting said first internal clock signal,
    selecting means for selectively outputting to said first delay line one of the first internal clock signal output from said first delay line and said external clock signal, first frequency dividing means for frequency-dividing said first internal clock signal, and first delay control means for detecting a phase difference between a signal output from said first frequency dividing means and said external clock signal and for controlling the delay time of said first delay line based on a result of the detection; and said second clock signal generating means includes a second delay line for delaying said first internal clock signal and outputting said second internal clock signal, second frequency dividing means for frequency dividing said second internal clock signal, and second delay control means for detecting a phase difference between a signal output from said second frequency dividing means and said external clock signal and controlling the delay time of said second delay line based on a result of the detection.

10. The internal clock signal generating circuit according to claim 9, wherein said selecting means alternately selects and outputs to said first delay line said external clock signal and said first internal clock signal;

said first frequency dividing means divides frequency of said first internal clock signal by 2;

said second frequency dividing means divides frequency of said second internal clock signal by 2;

said external clock signal is first selected by said selecting means;

said first frequency dividing means outputs the a signal synchronized with said first internal clock signal generated by delaying said first internal clock signal by said first delay line; and said second frequency dividing means outputs the signal synchronized with said second internal clock signal generated by delaying said first internal clock signal generated by delaying said external clock signal by said first delay line further by said second delay line.

11. The internal clock signal generating circuit according to claim 10, wherein said first delay control means adjusts the delay time of said first delay line so that said phase difference is within a first prescribed range; and said second delay control means adjusts the delay time of said second delay lines so that said phase difference is within a second prescribed range.

* * * * *